US008684015B2

(12) United States Patent
Lauerhaas et al.

(10) Patent No.: US 8,684,015 B2
(45) Date of Patent: Apr. 1, 2014

(54) TOOLS AND METHODS FOR PROCESSING MICROELECTRONIC WORKPIECES USING PROCESS CHAMBER DESIGNS THAT EASILY TRANSITION BETWEEN OPEN AND CLOSED MODES OF OPERATION

(75) Inventors: Jeffrey M. Lauerhaas, Waconia, MN (US); Jimmy D. Collins, Allen, TX (US); Tracy A. Gast, Waconia, MN (US); Alan D. Rose, Wylie, TX (US)

(73) Assignee: Tel FSI, Inc., Chaska, MN (US)

( * ) Notice: Subject to any disclaimer, the term of this patent is extended or adjusted under 35 U.S.C. 154(b) by 54 days.

(21) Appl. No.: 13/548,489

(22) Filed: Jul. 13, 2012

(65) Prior Publication Data

US 2012/0272893 A1    Nov. 1, 2012

Related U.S. Application Data

(62) Division of application No. 12/387,607, filed on May 5, 2009, now Pat. No. 8,235,062.

(60) Provisional application No. 61/127,129, filed on May 9, 2008.

(51) Int. Cl.
*B08B 15/00* (2006.01)
*B08B 15/02* (2006.01)
*B08B 11/00* (2006.01)

(52) U.S. Cl.
USPC .................... 134/183; 134/182; 134/902

(58) Field of Classification Search
USPC .................... 134/115 R, 104.2, 182, 902
See application file for complete search history.

(56) References Cited

U.S. PATENT DOCUMENTS 3,836,329 A    9/1974 Jordan
3,990,462 A    11/1976 Elftmann et al.

(Continued)

FOREIGN PATENT DOCUMENTS

| EP | 1 335 412 | 8/2003 |
| EP | 1 708 252 | 10/2006 |
| JP | 60 5530 | 1/1985 |
| JP | 63 73626 | 4/1988 |
| JP | 8 139065 | 5/1996 |

(Continued)

OTHER PUBLICATIONS

Lim, Jung-Soo, "The 6th Surface Cleaning Users Group Meeting, Cleaning Technology Symposium," handout, Sep. 19, 2007 (9 pages).
Adjustable Flow Air Amplifiers, http://www.airtxinternational.com/catalog/air_amplifiers.php?gclid=CMHsm_ix551CFQE . . . (3 pages), accessed Apr. 19, 2003.
Air Amplifier—Nex Flow™, http://www.process-controls.com/techsales/Nex_Flow/air_amplifier.htm (3 pages).

*Primary Examiner* — Michael Kornakov
*Assistant Examiner* — Natasha Campbell
(74) *Attorney, Agent, or Firm* — Kagan Binder, PLLC

(57) ABSTRACT

Strategies for tool designs and their uses wherein the tools can operate in either closed or open modes of operation. The tools easily transition between open and closed modes on demand. According to one general strategy, environmentally controlled pathway(s) couple the ambient to one or more process chambers. Air amplification capabilities upstream from the process chamber(s) allow substantial flows of air to be introduced into the process chamber(s) on demand. Alternatively, the fluid pathways are easily closed, such as by simple valve actuation, to block egress to the ambient through these pathways. Alternative flows of nonambient fluids can then be introduced into the process chamber(s) via pathways that are at least partially in common with the pathways used for ambient air introduction. In other strategies, gap(s) between moveable components are sealed at least with flowing gas curtains rather than by relying only upon direct physical contact for sealing.

9 Claims, 22 Drawing Sheets

(56) References Cited

U.S. PATENT DOCUMENTS

| | | | |
|---|---|---|---|
| 4,544,446 A | 10/1985 | Cady | |
| 4,609,575 A | 9/1986 | Burkman | |
| 4,639,270 A | 1/1987 | Ando et al. | |
| 4,682,615 A | 7/1987 | Burkman et al. | |
| 4,801,335 A | 1/1989 | Burkman et al. | |
| 4,903,717 A | 2/1990 | Sumnitsch | |
| 5,020,323 A | 6/1991 | Hürlimann | |
| 5,246,526 A | 9/1993 | Yamaguchi et al. | |
| 5,271,774 A | 12/1993 | Leenaars et al. | |
| 5,395,649 A | 3/1995 | Ikeda | |
| 5,453,132 A | 9/1995 | Kowalchuk | |
| 5,472,502 A | 12/1995 | Batchelder | |
| 5,513,668 A | 5/1996 | Sumnitsch | |
| 5,571,560 A | 11/1996 | Lin | |
| 5,688,322 A | 11/1997 | Motoda et al. | |
| 5,765,072 A | 6/1998 | Ohtani et al. | |
| 5,783,025 A | 7/1998 | Hwang et al. | |
| 5,785,068 A | 7/1998 | Sasaki et al. | |
| 5,873,380 A | 2/1999 | Kanno | |
| 5,900,059 A | 5/1999 | Shimanuki et al. | |
| 5,916,366 A | 6/1999 | Ueyama et al. | |
| 5,927,303 A | 7/1999 | Miya et al. | |
| 5,976,256 A | 11/1999 | Kawano | |
| 6,048,409 A | 4/2000 | Kanno et al. | |
| 6,051,371 A | 4/2000 | Mita et al. | |
| 6,065,424 A | 5/2000 | Shacham-Diamand et al. | |
| 6,090,205 A | 7/2000 | Sakai et al. | |
| 6,096,233 A | 8/2000 | Taniyama et al. | |
| 6,129,546 A | 10/2000 | Sada | |
| 6,149,759 A | 11/2000 | Guggenberger | |
| 6,193,798 B1 | 2/2001 | Sumnitsch | |
| 6,221,781 B1 | 4/2001 | Siefering et al. | |
| 6,230,722 B1 | 5/2001 | Mitsumori et al. | |
| 6,239,038 B1 | 5/2001 | Wen | |
| 6,243,966 B1 | 6/2001 | Lubomirsky et al. | |
| 6,247,479 B1 | 6/2001 | Taniyama et al. | |
| 6,260,562 B1 | 7/2001 | Morinishi et al. | |
| 6,273,104 B1 | 8/2001 | Shinbara et al. | |
| 6,299,804 B1 | 10/2001 | Domodossola et al. | |
| 6,332,470 B1 | 12/2001 | Fishkin et al. | |
| 6,385,863 B1 | 5/2002 | Kruwinus | |
| 6,398,975 B1 | 6/2002 | Mertens et al. | |
| 6,431,184 B1 | 8/2002 | Taniyama | |
| 6,435,200 B1 | 8/2002 | Langen | |
| 6,473,933 B1 | 11/2002 | Paterson et al. | |
| 6,488,040 B1 | 12/2002 | de Larios et al. | |
| 6,491,764 B2 | 12/2002 | Mertens et al. | |
| 6,494,221 B1 | 12/2002 | Sellmer et al. | |
| 6,536,454 B2 | 3/2003 | Lindner | |
| 6,589,338 B1 | 7/2003 | Nakamori et al. | |
| 6,589,361 B2 | 7/2003 | Luscher et al. | |
| 6,594,847 B1 | 7/2003 | Krusell et al. | |
| 6,672,318 B1 | 1/2004 | Tsuchiya et al. | |
| 6,680,253 B2 * | 1/2004 | Wirth et al. | 438/694 |
| 6,688,784 B1 | 2/2004 | Templeton | |
| 6,694,224 B2 | 2/2004 | Ramanan | |
| 6,705,331 B2 | 3/2004 | Sato et al. | |
| 6,737,104 B2 | 5/2004 | Suzuki et al. | |
| 6,810,888 B2 | 11/2004 | Tsuchiya et al. | |
| 6,826,910 B1 | 12/2004 | Easton | |
| 6,834,440 B2 | 12/2004 | Lee | |
| 6,874,516 B2 | 4/2005 | Matsuno et al. | |
| 6,896,466 B2 | 5/2005 | Nishimura et al. | |
| 6,901,938 B2 | 6/2005 | Sato et al. | |
| 6,913,651 B2 | 7/2005 | Ivanov et al. | |
| 6,939,807 B2 | 9/2005 | Yun et al. | |
| 7,022,193 B2 | 4/2006 | Jeong et al. | |
| 7,037,810 B2 | 5/2006 | Hayashi | |
| 7,051,743 B2 | 5/2006 | Kim et al. | |
| 7,089,076 B2 | 8/2006 | Geismar et al. | |
| 7,171,973 B2 | 2/2007 | Orii et al. | |
| 7,275,553 B2 | 10/2007 | Orii et al. | |
| 7,306,002 B2 | 12/2007 | Kim et al. | |
| 7,309,847 B2 | 12/2007 | Cao | |
| 7,323,080 B2 | 1/2008 | Kim et al. | |
| 7,332,055 B2 | 2/2008 | Orii et al. | |
| 7,364,625 B2 | 4/2008 | Christenson et al. | |
| 7,383,843 B2 | 6/2008 | Ravkin et al. | |
| 7,387,131 B2 | 6/2008 | Kuroda et al. | |
| 7,389,783 B2 | 6/2008 | Woods et al. | |
| 7,390,365 B2 | 6/2008 | Itoh et al. | |
| 7,404,407 B2 | 7/2008 | Orii et al. | |
| 7,422,641 B2 | 9/2008 | Nakajima et al. | |
| 7,436,486 B2 | 10/2008 | Hirukawa | |
| 7,476,616 B2 | 1/2009 | Christenson | |
| 7,531,039 B2 | 5/2009 | Sato et al. | |
| 7,543,593 B2 | 6/2009 | Orii et al. | |
| 7,584,760 B2 | 9/2009 | Miya et al. | |
| 7,639,343 B2 | 12/2009 | Hirukawa | |
| 7,681,581 B2 | 3/2010 | Rose et al. | |
| 7,699,932 B2 | 4/2010 | Miller et al. | |
| 7,712,475 B2 | 5/2010 | Fukuda et al. | |
| 7,819,984 B2 | 10/2010 | DeKraker et al. | |
| 7,827,930 B2 | 11/2010 | Lubomirsky et al. | |
| 7,913,706 B2 | 3/2011 | DeKraker et al. | |
| 8,235,062 B2 | 8/2012 | Lauerhaas et al. | |
| 2002/0029788 A1 | 3/2002 | Verhaverbeke et al. | |
| 2002/0063169 A1 | 5/2002 | Verhaverbeke et al. | |
| 2003/0051366 A1 | 3/2003 | Ise et al. | |
| 2003/0070695 A1 | 4/2003 | Emami et al. | |
| 2003/0084925 A1 | 5/2003 | Nakajima et al. | |
| 2003/0155325 A1 | 8/2003 | Mansour et al. | |
| 2003/0170988 A1 | 9/2003 | Izumi et al. | |
| 2003/0226577 A1 | 12/2003 | Orll et al. | |
| 2004/0050491 A1 * | 3/2004 | Miya et al. | 156/345.11 |
| 2004/0062874 A1 | 4/2004 | Kim et al. | |
| 2004/0226655 A1 | 11/2004 | Kajino et al. | |
| 2004/0261817 A1 | 12/2004 | Araki et al. | |
| 2005/0183750 A1 | 8/2005 | Matsuno et al. | |
| 2005/0244579 A1 | 11/2005 | Matsuzawa et al. | |
| 2006/0219258 A1 | 10/2006 | Gast | |
| 2006/0260647 A1 | 11/2006 | Verhaverbeke et al. | |
| 2007/0105380 A1 | 5/2007 | Orii et al. | |
| 2007/0245954 A1 | 10/2007 | Collins et al. | |
| 2008/0006303 A1 | 1/2008 | Butterbaugh et al. | |
| 2008/0008834 A1 | 1/2008 | Collins et al. | |
| 2008/0210278 A1 | 9/2008 | Orii et al. | |
| 2008/0213076 A1 | 9/2008 | Hanson et al. | |
| 2008/0271763 A1 | 11/2008 | Collins et al. | |
| 2008/0283090 A1 | 11/2008 | DeKraker et al. | |
| 2009/0015807 A1 | 1/2009 | Hirukawa et al. | |
| 2009/0280235 A1 | 11/2009 | Lauerhaas et al. | |

FOREIGN PATENT DOCUMENTS

| | | |
|---|---|---|
| JP | 2555034 | 11/1996 |
| JP | 09 314019 | 12/1997 |
| JP | 10 163154 | 6/1998 |
| JP | 11-087294 | 3/1999 |
| JP | 2000 124181 | 4/2000 |
| JP | 2001 015481 | 1/2001 |
| JP | 2001 267278 | 9/2001 |
| JP | 2002 246358 | 8/2002 |
| JP | 2002 343711 | 11/2002 |
| JP | 2003 109935 | 4/2003 |
| JP | 2004 31400 | 1/2004 |
| JP | 2004 153078 | 5/2004 |
| JP | 2004-265912 | 9/2004 |
| JP | 2005 039205 | 2/2005 |
| JP | 2005 235945 | 9/2005 |
| JP | 2006005315 A * | 1/2006 |
| JP | 2006 80403 | 3/2006 |
| TW | 406216 | 9/2000 |
| WO | WO 03/030228 | 4/2003 |
| WO | WO 2004/001828 | 12/2003 |
| WO | WO 2004/070807 | 8/2004 |
| WO | WO 2004/093166 | 10/2004 |
| WO | WO 2006/107549 | 10/2006 |
| WO | WO 2006/107550 | 10/2006 |
| WO | WO 2008/029848 | 3/2008 |

* cited by examiner

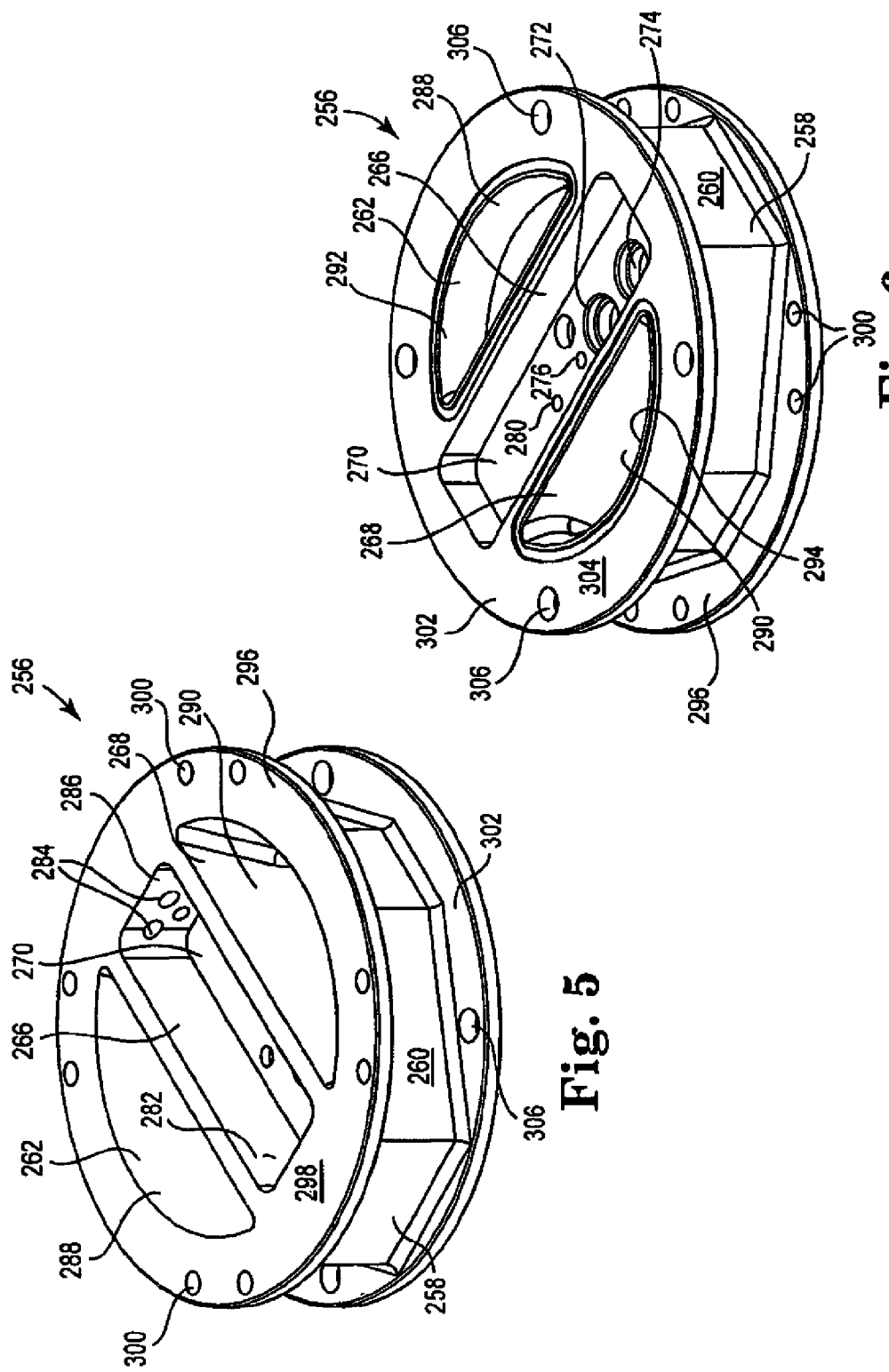

TOOLS AND METHODS FOR PROCESSING MICROELECTRONIC WORKPIECES USING PROCESS CHAMBER DESIGNS THAT EASILY TRANSITION BETWEEN OPEN AND CLOSED MODES OF OPERATION

PRIORITY

The present non-provisional patent application is a divisional application of U.S. patent application Ser. No. 12/387,607, filed May 5, 2009, now U.S. Pat. No. 8,235,062 by Lauerhaas et al. and titled TOOLS AND METHODS FOR PROCESSING MICROELECTRONIC WORKPIECES USING PROCESS CHAMBER DESIGNS THAT EASILY TRANSITION BETWEEN OPEN AND CLOSED MODES OF OPERATION, which Application claims the benefit of U.S. Provisional Patent Application having Ser. No. 61/127,129, filed on May 9, 2008, by Lauerhaas et al. and titled TOOLS AND METHODS FOR PROCESSING MICROELECTRONIC WORKPIECES USING PROCESS CHAMBER DESIGNS THAT EASILY TRANSITION BETWEEN OPEN AND CLOSED MODES OF OPERATION, both of which applications are incorporated by reference herein in their entireties and for all purposes.

FIELD OF THE INVENTION

The present invention relates to tools that are used to process microelectronic substrates with one or more treatment fluids, including liquids and/or gases. More particularly, the present invention relates to such tools with improved process chamber designs by which the process chambers can be isolated from or coupled to the ambient on demand using amplifying supply strategies for coupling to the ambient.

BACKGROUND OF THE INVENTION

The microelectronic industry relies on a variety of different processes to manufacture microelectronic devices. Many processes involve a sequence of treatments in which different kinds of treatment fluids are caused to contact the workpiece in accordance with desired recipes. These fluids may be liquids, gases, or combinations thereof. In some treatments, solids may be suspended or dissolved in a liquid or entrained in a gas.

Innovative tools for processing microelectronic workpieces are described in Assignee's co-pending U.S. patent application Ser. No. 11/376,987, now issued as U.S. Pat. No. 7,681,581 (hereinafter referred to as the Co-Pending Application No. 1); Assignee's co-pending U.S. patent application Ser. NO. 11/376,996, titled BARRIER STRUCTURE AND NOZZLE DEVICE FOR USE IN TOOLS USED TO PROCESS MICROELECTRONIC WORKPIECES WITH ONE OR MORE TREATMENT FLUIDS, in the names of Collins et al., filed Mar. 15, 2006, now published as U.S. 2007/0245954-A1 (hereinafter referred to as the Co-Pending Application No. 2) and being a counterpart to PCT published application WO 2006/107550; Assignee's Co-Pending U.S. patent application Ser. No. 11/820,709 titled BARRIER STRUCTURE AND NOZZLE DEVICE FOR USE IN TOOLS USED TO PROCESS MICROELECTRONIC WORKPIECES WITH ONE OR MORE TREATMENT FLUIDS, in the names of Collins et al., filed Jun. 20, 2007, now published as U.S. 2008/0008834-A1 (hereinafter referred to as Co-Pending Application No. 3); and Assignee's Co-Pending application Ser. No. 12/220,887, now issued as U.S. Pat. No. 7,913,606 (hereinafter referred to as the Co-pending Application No. 4). The entireties of these co-pending U.S. Patent Applications and these publications are incorporated herein by reference for all purposes.

The processing sections such as "processing section 11" of the co-pending U.S. Patent Application No. 1 advantageously includes nested duct features that allow one or more duct pathways to be selectively opened and closed. For example, when the structures are moved apart relatively, a duct pathway opens and is enlarged between the structures. When the structures are moved together relatively, the duct between the structures is choked and is reduced in size. In preferred embodiments, multiple ducts can exist in the same volume of space depending upon how the moveable duct structures are positioned. Thus, multiple ducts can occupy a volume minimally larger than the volume occupied by only a single duct. Because of the nested character of the duct structures, the duct system is extremely compact. The ducts are used to capture various treatment fluids, including liquid and/or gases, for recycling, discarding, or other handling. Different treatment fluids can be recovered in different, independent ducts to minimize cross-contamination and/or to use unique capture protocols for different fluids.

These co-pending U.S. Patent Applications also describe an innovative spray nozzle/barrier structure. This structure includes capabilities for dispensing treatment materials in multiple ways such as by a spray, a center dispense, and a showerhead. The barrier structure overlies the underlying workpiece. The lower surface of the barrier structure is shaped in preferred embodiments so that it defines a tapering flow channel over the workpiece. This approach offers many benefits. The tapering flow channel helps to promote radial flow outward from the center of the workpiece while minimizing recirculation zones. The taper also helps to smoothly converge and increase the velocity of flowing fluids approaching the outer edge of the workpiece. This helps to reduce liquid splash effects. The angle of the lower surface also helps liquid on the lower surface to drain toward the outer periphery where the liquid can be collected and removed such as by aspiration as taught in Assignee's co-pending Application No. 3. The tapering configuration also helps to reduce recirculation of particles back onto the workpiece. The configuration also helps facilitate chemical reclaim efficiency by better containment of fluids.

Notwithstanding all these benefits, further improvements are still desired. In particular, it would be desirable to use the tools described in Assignee's Co-Pending Applications Nos. 1 to 4 to carry out treatments in an environmentally isolated processing chamber. This might be desired anytime a controlled atmosphere is desired. One controlled atmosphere under investigation is an atmosphere with low or even substantially no oxygen content. The reduction in or substantial absence of oxygen helps prevent the corrosion of materials on an in-process microelectronic workpiece that might be vulnerable to oxidation. The current embodiments of these tools use a shutter around the showerhead and air intake components to help seal off the intake of ambient air into the process chamber. However, more ambient air than might be desired can still enter the process chamber from around the conventional showerhead and air intake design even when the shutter is closed. Additionally, these tools include an annular gap between the barrier plate and the surrounding baffle components. Ambient air can also enter the process chamber through this gap.

According to one option, such gaps can be eliminated by designing the tools in such a way that the components come into direct physical contact to close the gap in order to provide the desired seal. However, this kind of contact among the moving component(s) may be undesirable for at least two reasons. Firstly, contaminating particles may tend to be generated by the kind of force that would be needed to generate a good seal around the entirety of the gap. Second, it is often desirable to use stepper motors to control the movement of such components so that a controller can track the motor steps and hence the position of these components at any time. However, the kind of force needed to establish a good seal around the entire gap could tend to cause a controller to lose count of the motor steps. The ability to know and control movements of the components would be compromised when the stepper motor count is lost. These same concerns are at play when the shutter referred to above is deployed using stepper motor(s)

Clearly, being able to carry out treatments in isolation from the ambient is highly desirable. Yet, having a process chamber that can only operate in substantially full isolation from the environment is not always desirable, either. Many manufacturing strategies involve a series of treatments that involve both closed (i.e., isolated from sources of ambient air) and open (i.e., coupled to sources of ambient air) modes of operation. Of course, a manufacturing facility could procure separate, dedicated tools that operate in either a closed or open mode, respectively. But, such tools are quite expensive and represent a significant investment. Multiple tools occupy correspondingly larger portions of valuable facility space, too.

Accordingly, it is desirable to provide a tool that can effectively operate in either closed or open modes of operation with the capability to easily transition between open and closed modes on demand.

SUMMARY OF THE INVENTION

The present invention provides strategies for tool designs and their uses wherein the tools can operate in either closed or open modes of operation. The tools easily transition between open and closed modes on demand. According to one general strategy, environmentally controlled pathway(s) couple the ambient to one or more process chambers. Air amplification capabilities upstream from the process chamber(s) allow substantial flows of air to be introduced into the process chamber (s) on demand through these pathways. Alternatively, the fluid pathways are easily closed, such as by simple valve actuation, to block egress to the ambient through these pathways. Alternative flows of nonambient fluids can then be introduced into the process chamber(s) via pathways that are at least partially in common with the pathways used for ambient air introduction. This allows processing to occur in either controlled atmospheres and/or in the presence of ambient air.

In other strategies, gap(s) between moveable components are sealed at least with flowing gas curtains rather than by relying only upon direct physical contact for sealing. This minimizes particle generation and allows stepper motors to be used, if desired, to actuate the movement of these components in a reliable, controllable fashion with reduced risk that stepper motor count will be compromised. For instance, this strategy may be used to seal the annular gap between the baffle plate and the barrier plate in the tools described in Assignee's Co-Pending Applications Nos. 1-4. The illustrative application of this strategy to seal the gap between a baffle plate and barrier plate is described in more detail below.

In one aspect, the present invention relates to a system for processing a microelectronic workpiece. The system comprises a process chamber housing the workpiece and a fluid pathway fluidly coupling ambient air and the process chamber; said system comprising a first state in which an amplified flow of ambient air is introduced into the chamber through the fluid pathway, said amplified flow of ambient air being generated at least in part by a flow of a pressurized fluid flowing into the fluid pathway through an orifice upstream from the process chamber; and said system comprising a second state in which the process chamber and at least a portion of the fluid pathway are isolated from the ambient air and in which a non-ambient gas having a reduced oxygen content relative to ambient air is caused to flow into the process chamber through the fluid pathway.

In another aspect, the invention relates to a system for processing a microelectronic workpiece. The system comprises a process chamber housing the workpiece;

a fluid pathway fluidly coupling ambient air to the process chamber, said fluid pathway comprising:

a venturi in the fluid pathway positioned in a manner such that a flow of gas through the venturi establishes at least a portion of a boundary of the process chamber;

an orifice inlet into the fluid pathway that is located upstream from the venturi and that is fluidly coupled to a source of a pressurized gas, said orifice being configured and said pressurized gas being at a sufficiently higher pressure than ambient air such that a flow of the pressurized gas through the orifice and into the fluid pathway amplifyingly pulls ambient air into the fluid pathway that flows into the process chamber through the venturi, wherein the fluid pathway can be closed to isolate the process chamber and at least a portion of the fluid pathway from ambient air; and a source of a non-ambient gas that is fluidly coupled to the process chamber in a manner such that the non-ambient gas can be introduced into the process chamber through the venturi of the fluid pathway when the process chamber and at least a portion of the fluid pathway are isolated from the ambient.

In another aspect, the present invention relates to a method of treating a microelectronic workpiece, comprising the steps of:

positioning the workpiece in a processing chamber;

using a relatively low flow of a pressurized gas through an orifice to generate an amplified flow of ambient air;

introducing the amplified flow of air into the process chamber; and during at least a portion of the time during which the amplified air is introduced into the process chamber, subjecting the workpiece to a treatment.

In another aspect, the present invention relates to a system for processing a microelectronic workpiece, comprising:

a process chamber housing the workpiece, said process chamber comprising a boundary that isolates the workpiece from ambient air, wherein a portion of the boundary comprises a curtain of a flowing gas;

a moveable cover overlying the workpiece and defining at least a portion of a boundary of the processing chamber, said cover comprising a first state in which the cover is in a first position during a treatment of the workpiece housed in the process chamber and a second state in which the cover is in a second position that permits egress to the chamber and said cover optionally comprising at least one inlet through which at least one treatment fluid is introduced into the process chamber;

at least one boundary member having an edge proximal to but spaced apart from the cover when the cover is in the first state such that a gap exists between the cover and the at least one boundary member during a workpiece treatment;

a curtain of a flowing gas forming a boundary for the gap to help isolate the process chamber from ambient air during at least a portion of a treatment while the cover is in the first state.

In another aspect, the present invention relates to a system for processing a microelectronic workpiece, comprising:

a process chamber housing the workpiece, said workpiece having an outer periphery;

a moveable cover overlying the workpiece and having an outer periphery, said cover comprising at least one inlet through which at least one treatment fluid is introduced into the process chamber;

a moveable boundary defining at least a portion of an exhaust duct having an inlet proximal to the outer periphery of the workpiece, said moveable boundary having an inner periphery proximal to but spaced apart from the outer periphery of the cover during at least a portion of a treatment of the workpiece such that a gap exists between the cover and the moveable boundary; and a curtain of flowing gas forming a boundary across the gap to help isolate the chamber from ambient air during at least a portion of the treatment.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein:

FIG. 5 is a top, perspective view of the base member of the intake assembly of FIG. 3.

FIG. 6 is a bottom, perspective view of the base member of the intake assembly of FIG. 3.

DETAILED DESCRIPTION OF PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. While the present invention will be described in the specific context of improvements to the innovative, single wafer processing system described in Assignees co-pending applications cited herein (an embodiment of which is commercially available from FSI International Inc. under the trade designation ORION), the principles of the invention are applicable to other microelectronic processing systems as well.

Figure 1:
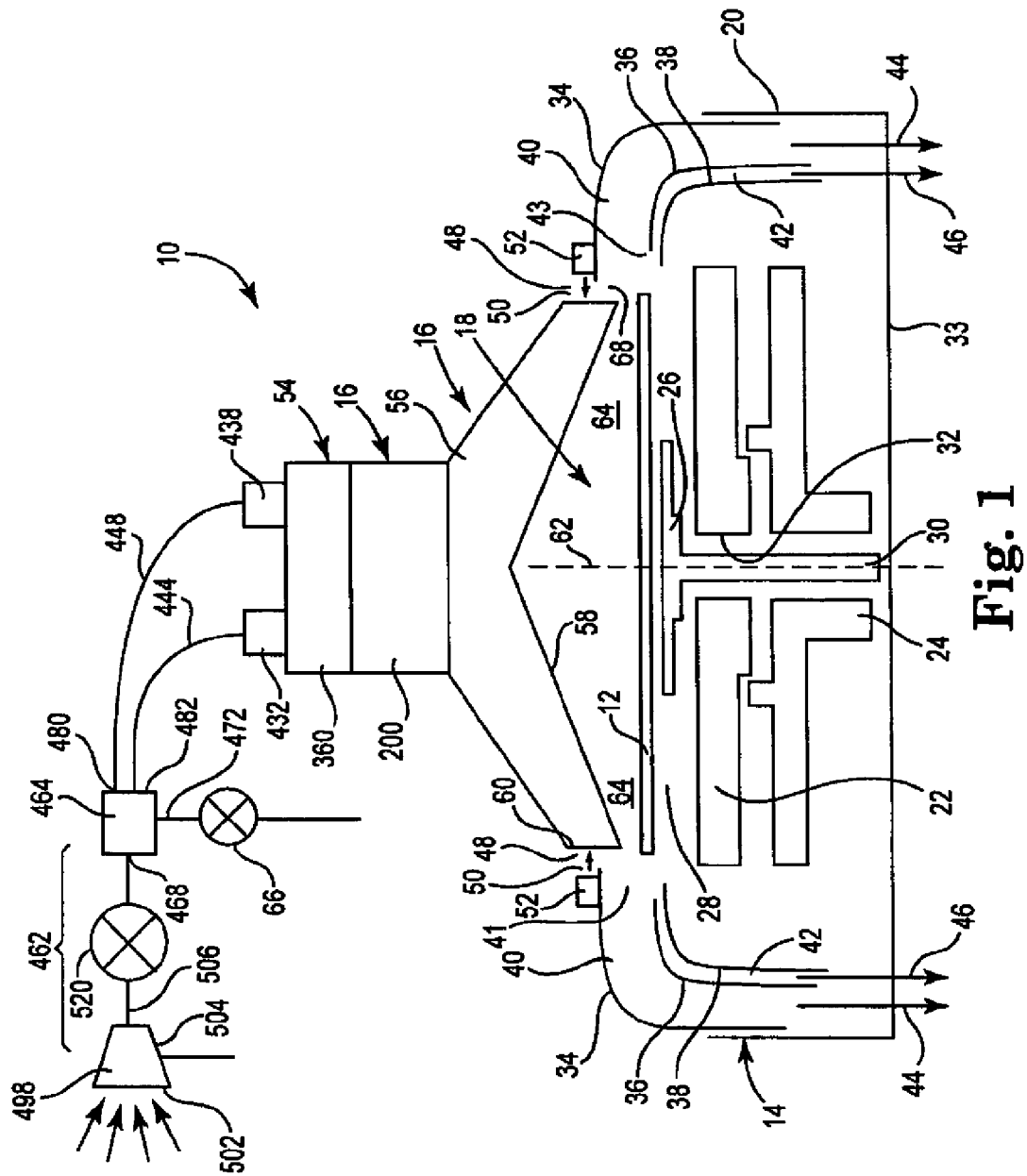
FIG. 1 is a schematic view of a single wafer processing tool incorporating principles of the present invention.
Figure 2:
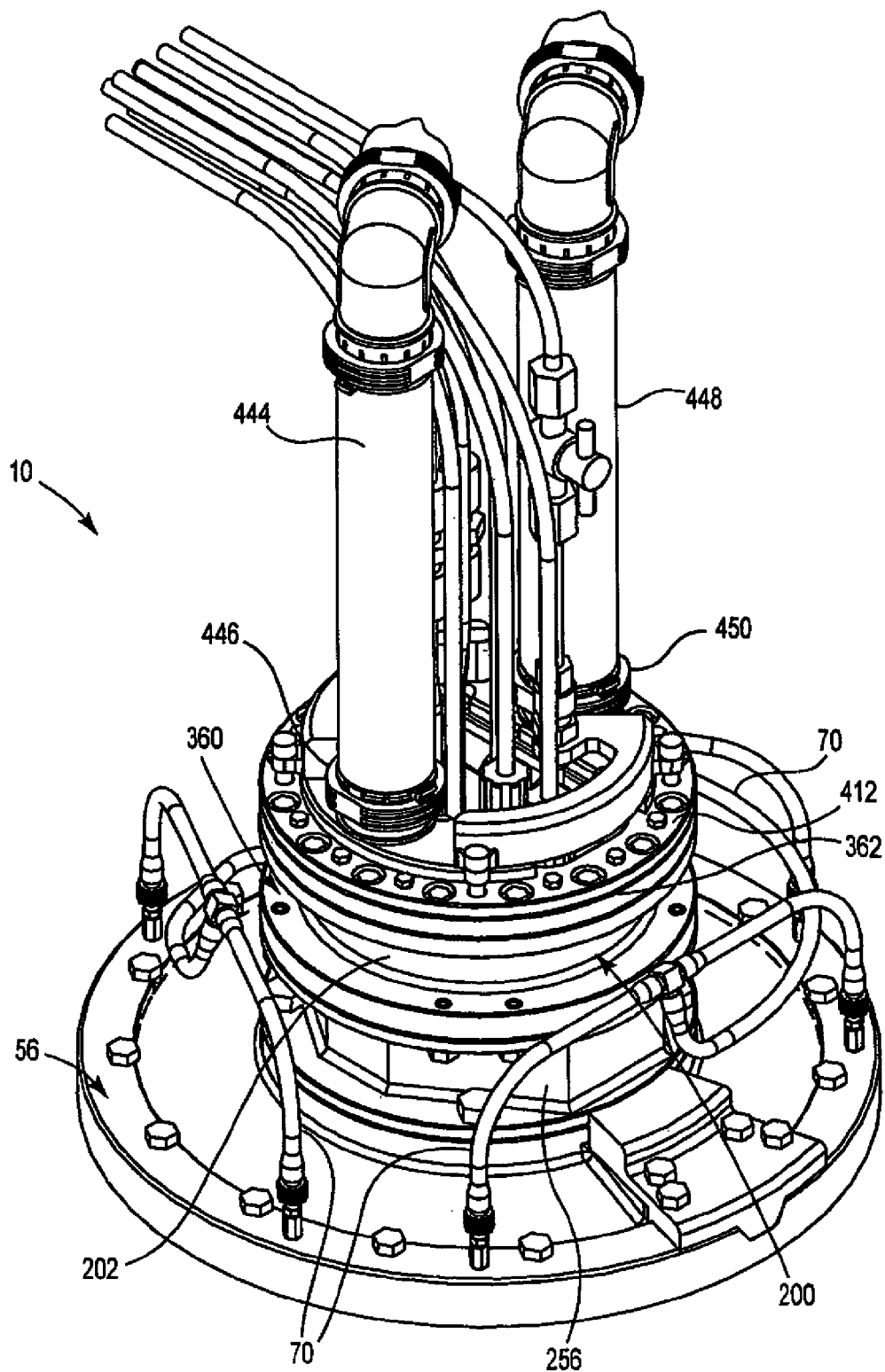
FIG. 2 is a perspective view of the collar and barrier plate assembly for the tool shown in FIG. 1.
Figure 3:
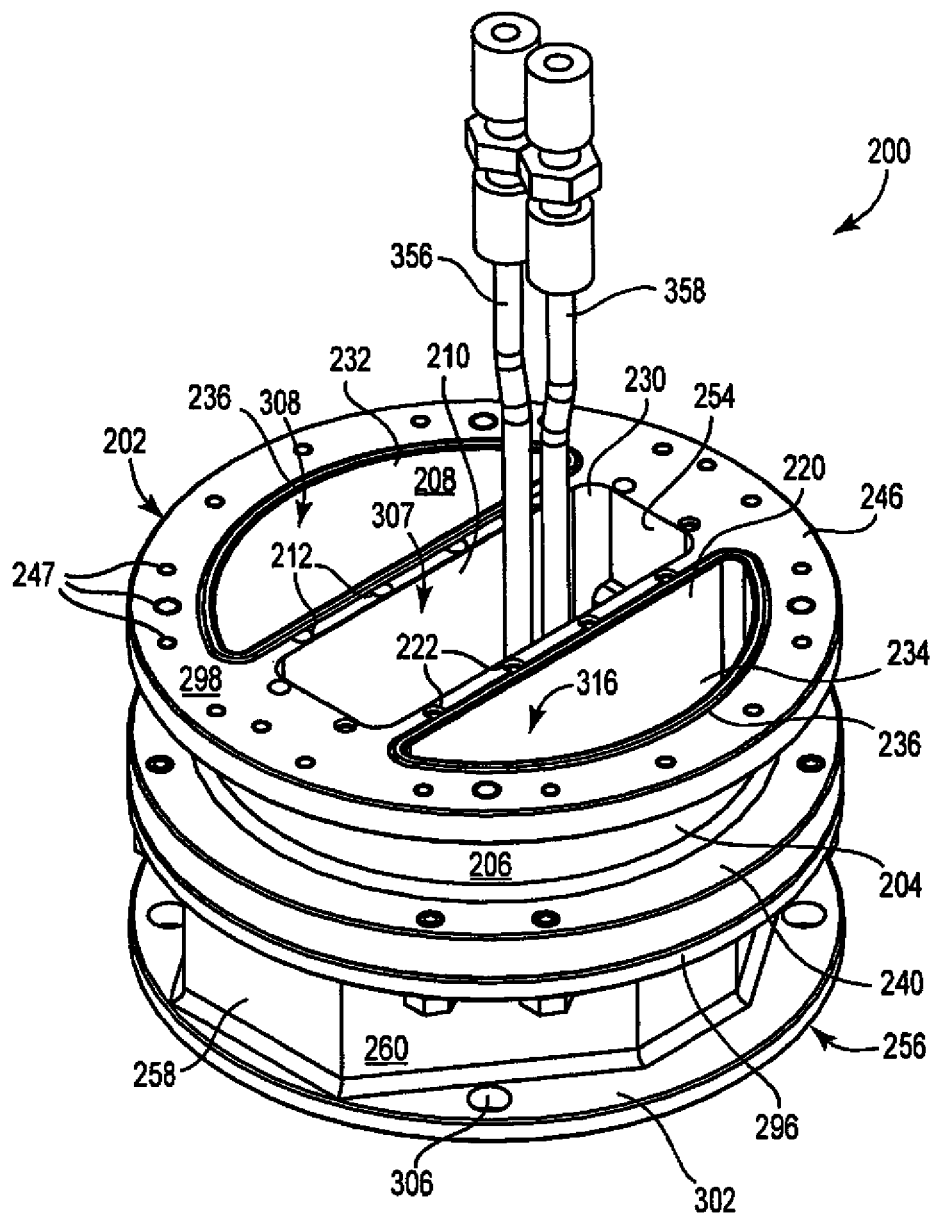
FIG. 3 is a top perspective view of the intake assembly and some associated plumbing used in the collar of the tool of FIG. 1.

The principles of the present invention may be used in connection with tools that process workpieces singly or in batches. FIG. 1 schematically shows an illustrative tool 10 that incorporates principles of the present invention. Tool 10 easily switches between open and closed modes of operation on demand. A "closed mode" of operation means that a treatment of one or more workpieces occurs in a process chamber of tool 10 in a controlled environment that is isolated from the ambient atmosphere external to the processing chamber and environmentally controlled fluid pathways of tool 10. One kind of controlled environment is one that has an inert atmosphere with a reduced oxygen content relative to the ambient so as to help reduce corrosion of corrosion-vulnerable materials on the workpiece(s) during processing. Inert gases such as nitrogen, argon, carbon dioxide, or the like are suitable for establishing such environments. In other applications, treatments may occur in reducing gases in which oxygen also is desirably excluded as much as is practical.

An "open mode" of operation means that a treatment occurs in the presence of ambient air that flows into a process chamber or is otherwise caused to be present in the process chamber. In the practice of the present invention, at least a portion and preferably most of the ambient air is supplied through environmentally controlled pathway(s) using air amplification techniques. Simple actions of opening or closing these pathway(s) and actuation of air amplification hardware allows ambient air to be introduced into or isolated from the chamber on demand. The physical positioning of external chamber boundaries themselves do not have to be altered to accommodate the transition between open and closed chamber modes, leading to a high degree of process uniformity. Additional ambient air may be allowed to enter the chamber through one or more gaps (as described below) or other orifices, although these may be blocked as desired with gas curtain(s), physical closure, physical barriers, or other boundaries to help prevent the ambient air from gaining egress into the chamber via such apertures.

For purposes of illustration, tool 10 is of the type in which a single workpiece 12 is housed in the tool 10 at any one time and subjected to one or more treatments in which liquid(s), gas(es), and/or other processing media are caused to contact the workpiece 12. In the microelectronics industry, for instance, tool 10 may be referred to as a single wafer processing tool. Workpiece 12 typically comprises a semiconductor wafer or other in-process microelectronic substrate.

As schematically shown in FIG. 1, tool 10 generally includes as main assemblies a base section 14 and a barrier/dispense section 16. In actual use, the base section 14 and the barrier/dispense section 16 would be mounted to a framework (not shown) and enclosed within a housing (not shown) of tool 10. This mounting can occur in any manner such as via screws, bolts, rivets, adhesives, welds, clamps, brackets, combinations of these, or the like. Desirably, though, the sections 14 and 16 and/or components thereof are independently and removably mounted to facilitate service, maintenance, upgrade, and/or replacement.

Base section 14 and barrier/dispense section 16 help define processing chamber 18 in which workpiece 12 is positioned during processing. Base section 14 and/or barrier/dispense section 16 include one or more features or capabilities to allow workpiece 12 to be loaded into and taken from processing chamber 18. Such features and capabilities may include, for instance, a door (not shown) that may be opened or closed to provide the desired egress. Alternatively, and as contemplated in preferred modes of practice, one or both of base section 14 and barrier/dispense section 16 are moveable relative to each other to provide this egress. Conveniently, this relative movement may occur in an illustrative embodiment, for instance, by raising and lowering barrier dispense section 16 while keeping at least a portion of base section 14 fixed to the surrounding framework (not shown). In embodiments in which the base section 14 includes one or more moveable baffle members such as described in Assignee's Co-Pending Applications Nos. 1 and 2, the baffle member can be raised and lowered to facilitate such egress.

Base section 14 generally includes a housing 20, chuck 22, motor 24, backside dispense head 26, and annular baffle members 34, 36, and 38. Inside processing chamber 18, workpiece 12 is supported and held by chuck 22. Chuck 22 may be stationary or it may be rotatable about a central axis. For purposes of illustration, the figures illustrate an embodiment of tool 10 in which chuck 22 is rotatably driven by motor 24 so that workpiece 12 may be spun about an axis during processing. In those embodiments in which workpiece 12 is spun by a rotating chuck 22, the spinning helps to spread dispensed treatment materials uniformly over the workpiece 12.

Chuck 22 may secure workpiece 12 in any of a variety of different ways in accordance with conventional practices now or hereafter developed. Preferably, chuck 22 includes edge gripping structures (not shown) that securely hold workpiece 12 such that there is a gap 28 between workpiece 12 and the chuck 22. This kind of positioning allows treatment chemicals, including rinse water, to be dispensed onto either the upper face or lower face of workpiece 12.

Optionally, tool 10 may include dispense structure(s) for treating the lower face of workpiece 12. An illustrative backside dispense mechanism is shown as a generally circular backside dispense head 26 through which one or more treatment chemicals may be dispensed toward lower face of workpiece 12. Treatment chemicals are supplied to backside dispense head 26 via shaft 30 that passes through central bore 32 of chuck 22. In embodiments in which chuck 22 rotates, there are gaps between shaft 30, and central bore 32 so that the parts do not contact as the chuck 22 rotates. The backside dispense head 26 may be coupled to one or more supplies (not shown) of treatment materials to be dispensed as supplied or blended on demand.

The housing 20 helping to enclose the process chamber 18 generally includes base pan 33 and movable, annular baffle members 34, 36, and 38. The baffle members 34, 36, and 38 provide movable boundaries defining at least a portion of exhaust ducts 42 and 44. The ducts 42 and 44 are used to capture various treatment fluids for recycling, discarding, or other handling. Different treatment fluids can be recovered in different, independent ducts to minimize cross-contamination and/or to use unique capture protocols for different fluids. Each of the ducts 42 and 44 has a respective inlet 41 and 43 proximal to the outer periphery of the workpiece 12. Each of the docs 42 and 44 has a respective outlet 44 and 46 through which material(s) are discharged.

Adjacent baffle members are movable toward or away from each other in order to choke or open a corresponding duct pathway. For example, when adjacent baffle members are moved apart relatively, a duct pathway opens between them and is enlarged between the structures. When the structures are moved together relatively, the duct between the structures is choked and is reduced in size. For purposes of illustration, the exhaust duct 40 between the top baffle member 34 and the middle baffle member 36 is open, while the lower exhaust duct 42 between the middle baffle member 36 and the bottom fell full member 38 is choked.

For purposes of illustration, tool 10 includes three movable and nestable baffle members 34, 36, and 38 with two exhaust ducts 42 and 44 formable between these members. However, other embodiments of the invention may include a greater or lesser number of baffle members than this, and thus a correspondingly greater or lesser number of exhaust ducts.

There is a gap 48 between the base section 14 and the barrier/dispense section 16. When the tool 10 is operated in a closed mode of operation, such as a treatment of workpiece 12 in which oxygen from the ambient or other sources is to be excluded from the process chamber 18, it is desirable to block and/or eliminate this gap 48 so that oxygen cannot gain egress into the process chamber 18 through this gap 48.

Advantageously, principles of the present invention allow the gap 48 to be sufficiently sealed by using a curtain 50 of flowing gas ejected from member 52 to form a boundary across the gap 48 to isolate the chamber 18 from the ambient external to the chamber 18. This boundary in the form of curtain 50 can be established on demand at any time such as during at least a portion of any treatment in which it is desired to isolate the chamber 18 from the ambient for any reason. A pressurized gas supplied to member 52 from a suitable source (not shown) via suitable plumbing (not shown), such as nitrogen, carbon dioxide, argon, combinations of these, and the like may be used to form curtain 50.

In particularly preferred embodiments, the base section 202 is in the form of the "processing section 11" described and illustrated in Assignee's Co-Pending Applications Nos. 1 and 2. In such embodiments, the member 52 is positioned on a baffle member, preferably the top baffle member 34, and is positioned in a manner effect is to generate an annular curtain 50 of gas between the inner rim of the baffle member and the outer periphery of the adjacent barrier plate structure. A representative embodiment of the invention having this structure is described in more detail further below.

As shown schematically in FIG. 1, an illustrative embodiment of barrier/dispense section 16 generally includes collar 54 centrally mounted onto the barrier plate 56. The barrier/dispense section 16 is similar to the "dispense assembly 554" of Assignee's Co-Pending Applications Nos. 1 through 4 and therefore may be coupled to the "moveable member 526" and substituted for the barrier/dispense sections described, shown, and/or referred to in these co-pending Applications. However, due to the features of collar 54 and the environmentally controlled fluid pathways associated with collar 54, the barrier/dispense section 16 of the present invention incorporates fluid pathways that are more environmentally controlled and that can be more easily coupled to or isolated from the ambient upon demand. Collar includes showerhead dispense member 360 mounted onto the top of intake assembly 200.

A preferred embodiment of barrier plate 56 is described as "barrier plate 102" in Assignee's Co-Pending Application No. 3. According to this preferred embodiment, barrier plate 56 is generally annularly shaped, having a lower surface 262. Advantageously, lower surface 58 of barrier plate 56 includes one or more features that help to collect and remove liquid that may be present. As one strategy, aspiration features and techniques may be used for liquid removal as described in Assignee's Co-Pending Application No. 3. To this end, tubing 70 is provided for aspirating liquid from the lower surface 58 of the barrier plate 56. Via z-axis movement of "moveable support member 526" according to Assignee's Co-pending Applications Nos. 1 and 2, the position of barrier plate 56 relative to the underlying workpiece 12 can be controlled.

Preferably, at least lower surface 58 of barrier plate 56 is angled downward in a radially outward direction from the central axis 62 relative to the underlying plane of workpiece 12 to establish a tapering flow channel 64 between workpiece 12 and lower surface 58 of barrier plate 56. The tapering configuration of channel 64 helps to promote radial flow outward from the center of workpiece 12 while minimizing recirculation zones. The taper also helps to smoothly converge and increase the velocity of flowing fluids approaching the outer edge of workpiece 12. This helps to reduce liquid splash effects. The angle of lower surface 58 also helps liquid on lower surface 58 to the outer periphery, where the collected liquid can be aspirated away rather than drip downward onto workpiece 12. The tapering configuration also helps to reduce recirculation of particles back onto workpiece 12. The configuration also helps facilitate chemical reclaim efficiency by better containment of fluids.

Additionally with respect to this particular embodiment, the generally annular barrier plate 56 functions in one respect as a lid or cover over processing chamber 18 in order to help provide a protected environment for workpiece treatment and to help contain dispensed materials in the processing chamber 18. However, because the barrier plate 56 is movable up and down in many embodiments, the generally annular barrier plate 56 preferably comes into close proximity, rather than direct physical contact with, other barriers helping to define processing chamber 18, such as to establish the gap 48. This minimizes particle generation that might otherwise occur as a result of such contact. This also minimizes the risk that a controller will lose track of stepper motor steps that might occur in the course of movement of the barrier plate 56.

The angled lower surface 58 can have a variety of geometries. For instance, the geometry can be one or more of linear (conical), parabolic, polynomial, or the like. For purposes of illustration, the lower surface 58 generally linearly converges toward workpiece 12 in a radially outward direction.

Barrier/dispense section 16 desirably includes one or more independent mechanisms for dispensing treatment materials into the processing chamber 18. For instance, the illustrative embodiment includes at least one, preferably at least two, and more preferably at least three different kinds of dispensing capabilities. As one capability, a dispensing structure is included that sprays one or more treatment fluids downward toward workpiece 12, generally across a radius of workpiece 12 so that full surface coverage is obtained via rotation of the workpiece 12 below the spray. In preferred embodiments, this capability is provided by a dispensing structure such as a spray bar mounted to barrier plate 56 and intake assembly 200. A preferred embodiment of such a spray bar and methods of incorporating such a spray bar into a barrier/dispense section are described in Assignee's Co-Pending Application No. 3 as "spray bar 178".

As another dispensing capability, a dispensing structure is included that dispenses treatment chemicals generally downward onto the center of the underlying workpiece 12. As workpiece 12 spins, the centrally dispensed materials are distributed over the workpiece surface. In preferred embodiments, this capability is provided by a central dispense nozzle assembly mounted to the intake assembly 200. A preferred embodiment of such a nozzle is described as "center dispense nozzle assembly 518" in Assignee's Co-Pending Application No. 3. The mounting of this unit occurs similarly as is described in this co-pending application and is described further below.

Additionally, showerhead dispense member 360 mounted and supported on the intake assembly 200 provides still yet another way to introduce processing materials, typically gases and/or vapors, optionally including entrained materials, into the processing chamber 18. The showerhead dispense member dispenses one or more of such flows into corresponding venturi shaped pathways in the downstream intake assembly 200. From the venturi shaped pathways, the one or more flows are dispensed downstream into the process chamber. The venturi features in the venturi shaped pathways of the intake assembly help promote containment of the flows in the process chamber, helping to prevent backflow into the environmentally controlled fluid pathways extending upstream from collar 54.

The dispensing components of the barrier/dispense section 16 may be coupled to one or more supplies (not shown) of treatment materials provided via suitable supply lines. These materials can be dispensed as supplied or blended on demand. A wide variety of treatment materials may be used, as tool 10 is quite flexible in the types of treatments that may be carried out. Just a small sampling of representative treatment materials include gases and liquids such as nitrogen, carbon dioxide, clean dry air, steam, argon, HF gas, aqueous HF, aqueous isopropyl alcohol or other alcohols and/or tensioactive material(s), deionized water, aqueous or other solutions of ammonium hydroxide, aqueous or other solutions of sulfuric acid and/or its desiccating species and precursors (e.g. sulfur trioxide ($SO_3$), thiosulfuric acid ($H_2S_2O_3$), peroxosulfuric acid ($H_2SO_5$), peroxydisulfuric acid ($H_2S_2O_8$), fluorosulfuric acid ($HSO_3F$), and chlorosulfuric acid ($HSO_3Cl$)), aqueous or other solutions of nitric acid, aqueous or other solutions of phosphoric acid, aqueous or other solutions of hydrogen chloride, oxidizers such as hydrogen peroxide and/or ozone gas, aqueous ozone, surfactants, organic acids and solvents, chelating agents, oxygen scavengers, combinations of these and the like.

Amplified gas distribution station 462 is upstream from the collar 54 and is fluidly coupled to showerhead dispense member 360. For purposes of illustration, station 462 is fluidly coupled to collar 54 via two supply lines 444 and 448. Each supply line serves as a feed to an independent showerhead chamber within showerhead dispense member 360. In other embodiments, more or less supply lines may be used if desired.

Amplified gas distribution station 462 includes as main components air amplifier 498, valve 520, and manifold 464. Manifold 464 includes an inlet 468 for receiving a flow of amplified air and one or more independent inlets for receiving flows of non-ambient gases. For purposes of illustration, a single such independent inlet 472 is shown for supplying manifold with a supply of an inert gas such as nitrogen, carbon dioxide, or the like.

Air amplifier 498 includes an inlet 504 for receiving a pressurized gas flow and an air intake 502 for receiving a feed of ambient air. The flow of the pressurized gas flow into air amplifier 498 draws in a flow of air from the ambient. When valve 520 is open, the flow of ambient air flows to manifold 464. There, the air flows to showerhead dispense member 360 via lines 444 and 448. When the valve 520 is closed whether or not the flow of pressurized gas into the inlet 504 of air amplifier 498 is stopped (although it is desirable to stop the flow of the pressured gas into inlet 504 when valve 520 is closed), the environmentally controlled fluid pathways extending through manifold 464, supply lines 444 and 448, showerhead dispense member 360, and intake assembly 200 are isolated from the ambient. A flow of one or more non-ambient gases, such as an inert gas such as nitrogen, an etching gas, and/or the like, can be introduced into the fluid pathways via manifold 464 through supply line 444 and 448 by opening valve 66. If it is desired to further isolate chamber 18 from the ambient so as to exclude oxygen or for any other reason, the member 52 may be used to generate a curtain 50 of gas to establish a barrier across gap 48.

FIGS. 1 and 2 through 26 show in more detail representative strategies by which the principles of the present invention can be incorporated into and thereby modify the barrier/dispensing section described in Assignee's Co-Pending Application Nos. 1-4. As an overview of the modifications relative to the barrier/dispensing section used in the co-pending application No. 4, the air intake and showerhead structures of the present invention forming collar 54 are modified so that the gas flow paths through these components are more isolated in terms of exposure to the ambient. Specifically, the environmentally controlled fluid pathway(s) for gases encompass pathway portions extending through at least portions of the amplified gas distribution station 462, the supply lines 444 and 448, the showerhead dispense member 360, and intake assembly 200 are very effectively sealed from the surrounding ambient. Accordingly, the shutter used in prior embodiments with respect to prior showerhead and intake assembly embodiments shown in co-pending application Nos. 1 through 4 is no longer needed. The improved isolation provided by the fluid pathway strategies contributes toward the ease by which the tool 10 may be switched between open and closed modes of operation.

Further, air amplification components described further below desirably are included upstream from the air intake and/or showerhead structures as a strategy for supplying large volumes of air from the ambient on demand (the ambient in this context may be any source of ambient air such as the highly purified air in a surrounding clean room facility or the highly purified air in a robotics area of the tool itself, which may be even more pure than the surrounding clean room facility in some cases, another purified source of air, or any other ambient source) to the process chamber via a pathway that includes the showerhead and air intake structures. Consequently the showerhead structure also is modified to handle the much large flows of ambient air supplied by the air amplifying components without undue pressure drop and to minimize turbulence in the resultant flow. The showerhead also helps to distribute the resultant flow into the process chamber 18.

Intake assembly 200 incorporated as a component of collar 54 is shown in more detail in FIGS. 2 through 10. Intake assembly generally includes top member 202, base member 256, and rinsing member 324 clamped between top member 202 and base member 256. Top member 202 generally includes body 204, top flange 246, bottom flange 240, wall 210, and wall 220. Annular shaped body 204 generally has an undercut outer wall face 206 and a smoothly countered inner wall face 258. Outer wall face 206 is undercut for weight savings and to provide easier access to assembly hardware. The smooth contour of inner all face 258 helps promote smoother flow of gas through intake assembly 200. Walls 210 and 220 generally subdivide the interior volume of top member 202 into a central through aperture 230, a first D-shaped aperture 232, and a second D-shaped aperture 234. The central through aperture 230 helps to define a portion of a pathway through which plumbing, electrical lines, fiber optics, sensors, and other tool componentry may be led while being isolated from fluid pathways through D-shaped apertures 232 and 234. The D-shaped apertures 232 and 234 help to define the inlet regions 310 and 318 of venturi-shaped pathways 308 and 316 through which gases may be introduced into processing chamber 18 with excellent containment characteristics. Walls 210 and 220 help to reinforce and strengthen top member 202. Walls 210 and 202 also help to support showerhead dispense member 360 when the intake assembly 200 and the showerhead dispense member 360 are assembled.

The top faces 214 and 224 of the walls 210 and 220 and the upper face 248 of top flange 246 include threaded apertures 212 and 222. These provide a secure way to mount showerhead dispense member 360 onto intake assembly using screws (not shown). The use of screws also facilitates easy disassembly for maintenance and repair. Of course, any time that screws are used in this or other fastening contexts of the present invention, other assembly techniques such as rivets, glue, welds, bolts, clamps, tape, combinations of these, and/or the like may be used.

The bottom of body 204 includes an annular rabbet 244 on its inner periphery. The walls 210 and 220 also include rabbets 216 and 226 along their bottom edges. The rabbets 244, 216, and 226 form a pocket for clamping rinsing member 324 in position when the components of intake assembly 200 are assembled. An end wall 254 of the central through aperture 230 includes a cut-out region 250 that fits over plumbing connections 338 of the rinsing member 324. End wall 254 also includes a threaded aperture 252 that is used to help secure retaining clamp 342 to end wall 254, described further below. This clamp 342, in turn, helps secure plumbing supply lines 356 and 358 to plumbing connections 338.

Bottom flange 240 extends radially outward from the lower end of top member 202, and top flange 246 extends radially outward from a top end of top member 202. Flanges 240 and 246 help to stiffen body 204 and also provides a way for securing top member 202 to other components. To this end, bottom flange 240 includes apertures for securing top member 202 to base member 254 with suitable fasteners (not shown). Similarly, top flange includes apertures 247 on its upper face 248 for securing top member to the showerhead dispense member 360 and/or to framework (not shown) of tool 10.

Top member 202 may be formed from a wide variety of materials that may be hydrophobic or hydrophilic. It is desirable in some embodiments to fabricate top member 202 from a hydrophobic material such as a fluoropolymer. In representative embodiments, polytetrafluoroethylene is a suitable material.

Base member 256 generally includes body 258, top flange 296, bottom flange 302, wall 266, wall 268, and recessed floor 270. Body generally includes faceted outer wall face 262 and smoothly contoured inner wall face 262. Outer wall face 262 is faceted to provide weight savings and easier access to assembly hardware. Inner wall face 262 is smoothly contoured to promote smooth gas flow through intake assembly 200. Inner wall face 262 is also contoured so that body 258 includes a thickened wall portion 264 intermediate between the top and bottom of base member 256. Thickened wall portion 264 helps to provide the throat regions 314 and 322 of the venturi pathways 308 and 316.

Top flange 296 extends outward from the top end of base member body 258 and is generally annular in shape. Top flange 296 includes apertures 300 for attaching base member to top member 202 with suitable fasteners. The upper face 298 of top flange 296 may be flat as shown to match the contour of the bottom flange 240 of top member 202 to which it is attached. However, the flanges 296 and 240 may have engaging contours that are not flat if desired. For instance, grooves, protuberances, undulations, or other features may be provided to assist with alignment during assembly. Optionally, a gasket (not shown) may be interposed between flanges 296 and 240 to promote a more fluid tight seal if desired.

Bottom flange 302 extends outward from bottom end of body 258 and also is generally annular in shape. Bottom flange 302 includes through apertures 306 for securing intake assembly to the barrier plate 56 shown in FIG. 1 with suitable fasteners, which preferably has the features as described with respect to described in any of Assignee's Co-Pending Applications Nos. 1-4 cited herein. The barrier plate with integrated spray bar features as shown in Assignee's Co-Pending Application No. 3 is preferred. A specific embodiment of a particularly preferred barrier plate with integrated spray bar features is included in the ORION tool available from FSI International, Inc.

Walls 266 and 268 extend from one side of body 258. When the intake assembly 200 is assembled, these walls 266 and 268 are underneath and aligned with the walls 210 and 220 of top member 202, respectively. Consequently, the walls 266 and 268 similarly generally subdivide the interior volume of base member 256 into a central aperture 282 aligned with the central through aperture 230, generally D-shaped aperture 288 aligned with D-shaped aperture 232, and generally D-shaped aperture 290 aligned with D-shaped aperture 234. Together, D-shaped apertures 288 and 232 define a first venturi-shaped pathway 308 through intake assembly 200, and the D-shaped apertures 290 and 238 define a second venturi pathway 316 through the intake assembly 200. The first venturi-shaped pathway 308 extends from an inlet 310 to an outlet 312 and includes throat region 314 where pathway 308 is constricted relative to the flaring inlet 310 and outlet 312. Similarly, second venturi-shaped pathway 316 extends from an inlet 318 to an outlet 320 and includes throat region 322 where the pathway 316 is constricted relative to the flaring inlet 318 and outlet 320.

Each of venturi-shaped pathways 308 and 316 allow gases with or without entrained constituents to be introduced into the underlying process chamber 18 with excellent containment capabilities. In use, one or more gases such as air, clean dry air, steam, nitrogen, carbon dioxide, argon, isopropyl alcohol vapor, combinations of these and the like are caused to enter intake assembly 200 via inlets 310 and 318. The one or more gases are discharged downward into processing chamber 18 through outlets 312 and 320. The venturi-shaped passages 308 and 316 function as a containment system in situations in which treatment materials, which may be liquid, solid, or gas, are desirably contained in a chamber that requires an opening for the introduction of processing gases. In other words, at a sufficient flow rate through the venturi region, the fluids tend to flow in one direction through the venturi with minimal backflow. Consequently, the venturi functions as a boundary below which fluid materials are contained in an underlying process chamber even though the fluid pathways through air intake 200 are not blocked by a physical, solid barrier.

For example, during a typical process, make-up air or other gas might be caused to enter a process chamber through the venturi-shaped pathways 308 and 316. The incoming air or gas accelerates as it passes through the throat regions 314 and 322 of the pathways 308 and 316. The relatively higher velocity air or gas moving through the throat regions 314 and 322 and into the chamber substantially prevents mist or other processing liquids from escaping back up into intake assembly 200. In contrast, in an air intake passage lacking a throat constriction or sufficient height, process chamber mist could escape, causing safety concerns, contamination, reduced process performance due to loss of processing material, and the like.

In one illustrative operation condition, substantially complete mist and steam containment would be achieved using about 10 to about 50 cfm inlet air. In this test, the workpiece would be spun on its chuck at 250 rpm while being sprayed with 1 liter per minute deionized water at 65° C. In this illustrative example, the width of each of the venturi throats could be 1.067 inches, while each corresponding inlet and outlet has a width of 1.44 inches. The length of each of the venturi-shaped passages could be three inches. In open modes, the flow of air could be established using air amplification with or without pulling an exhaust on the chamber. In closed modes, an exhaust can be pulled to help establish such a flow.

Being aligned with central through aperture 230, the central aperture 282 helps to define a further portion of a pathway 307 through which plumbing, electrical lines, fiber optics, sensors, and other tool componentry may be led while being isolated from fluid pathways 308 and 316 of the intake assembly 200 and vice versa. Apertures 284 in one of the end walls 286 provide egress to and from central aperture 282 for components entering and leaving the bottom of central aperture 282 near floor 270. For instance, tubing 70 can be lead down through central aperture 307 and then out to the aspirating features of the barrier plate to which intake assembly 200 is attached. Optionally, supply 356 and 358 for supplying rinsing fluid to rinsing member 324 might also be fed through apertures 284, although it is more preferred to install such rinse supply lines as shown in the Figures. If any of such apertures 284 are not used, it may be desirable to plug them with removable plugs.

Walls 266 and 268 serve other functions as well. Being aligned with the walls 210 and 220 of top member 202, respectively, walls 266 and 268 help to support the showerhead dispense member 360. The walls 266 and 268 also help to reinforce and strengthen base member 256. The top faces of these walls, along with the upper face 298 of top flange 296, fit securely against bottom of the top member 202 to help clamp rinsing member 324 in position when top member 202 and base member 256 are secured together.

Figure 4:
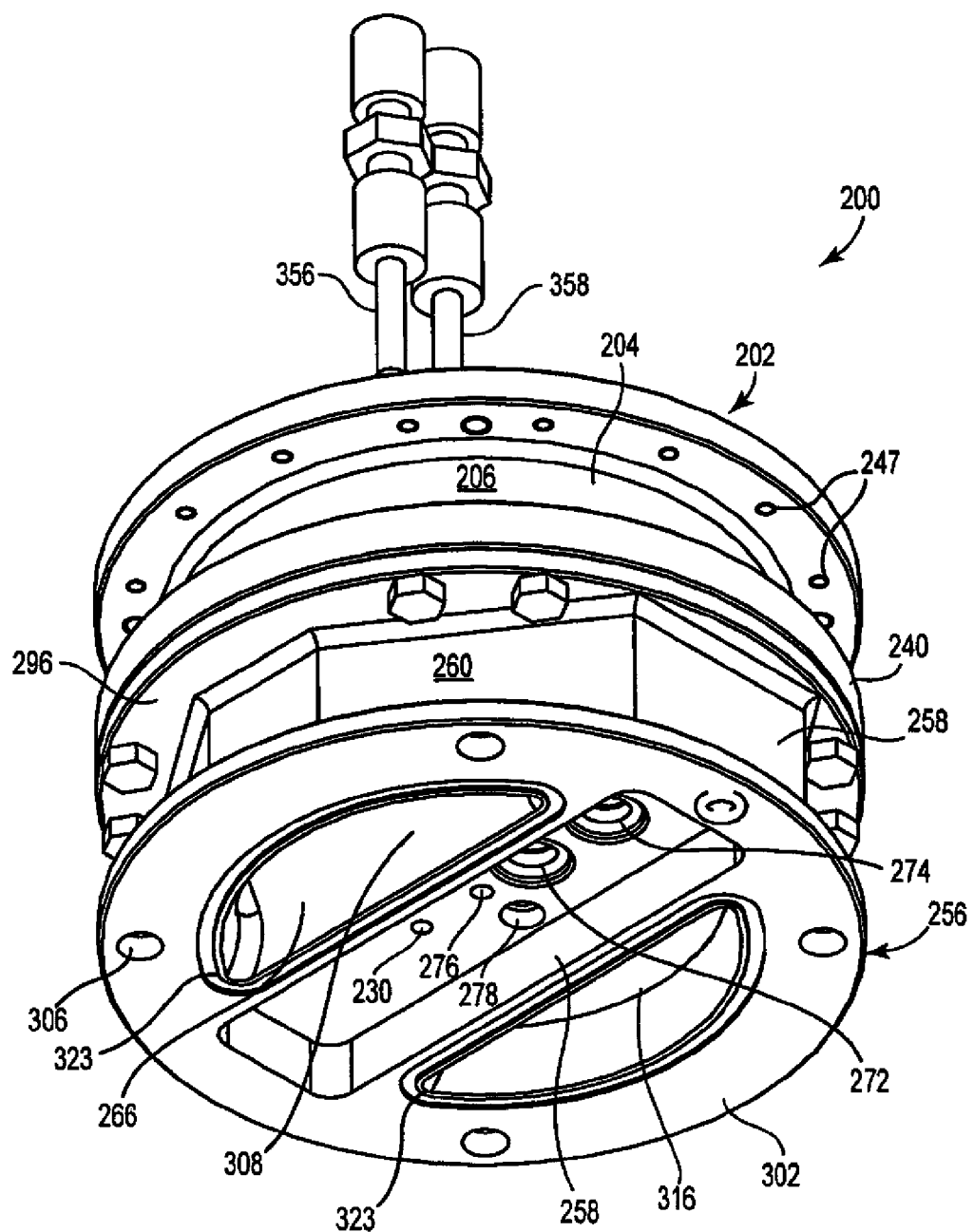
FIG. 4 is a bottom perspective view of the intake assembly and some associated plumbing shown in FIG. 3.
Figure 7:
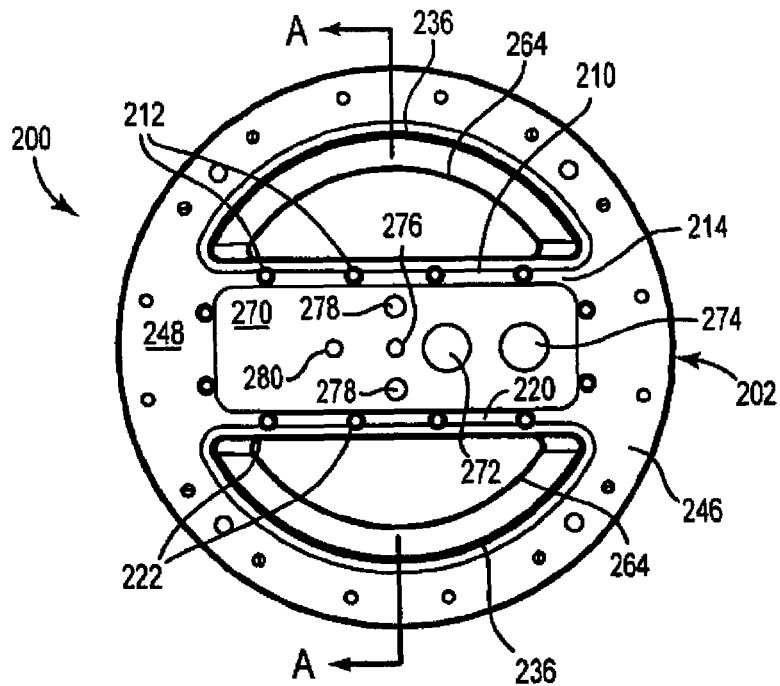
FIG. 7 is a top view of the intake assembly of FIG. 3.
Figure 8:
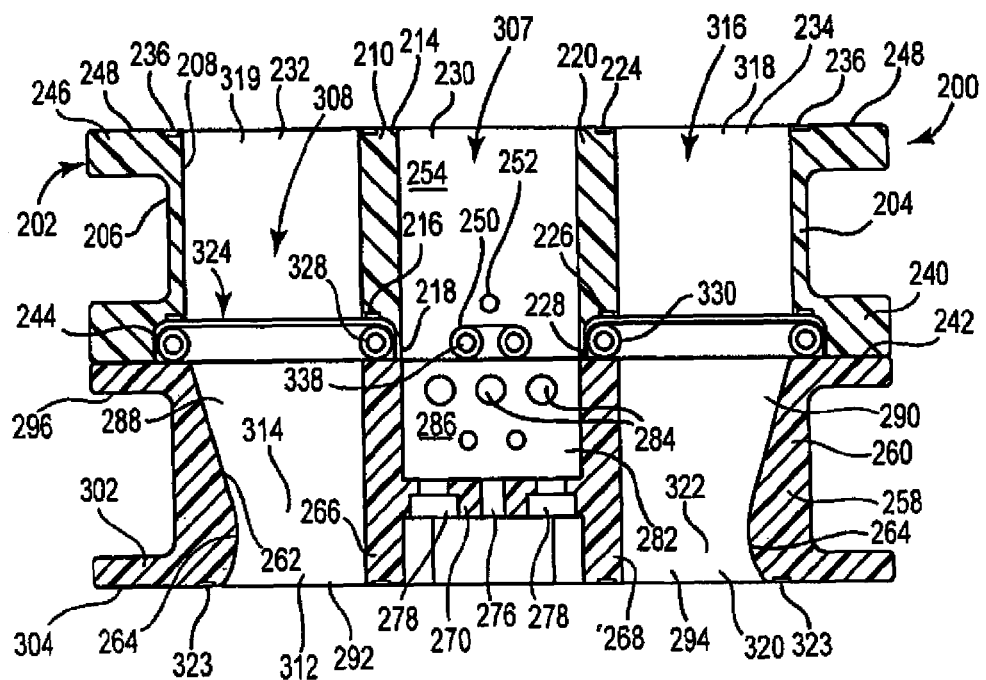
FIG. 8 is a cross-section of the intake assembly taken along line A-A of FIG. 7.
Figure 10:
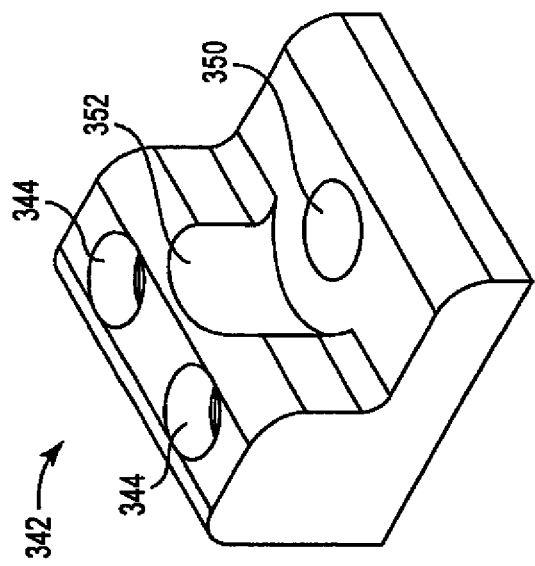
FIG. 10 is a perspective view of the clamp shown in FIG. 9.
Figure 9:
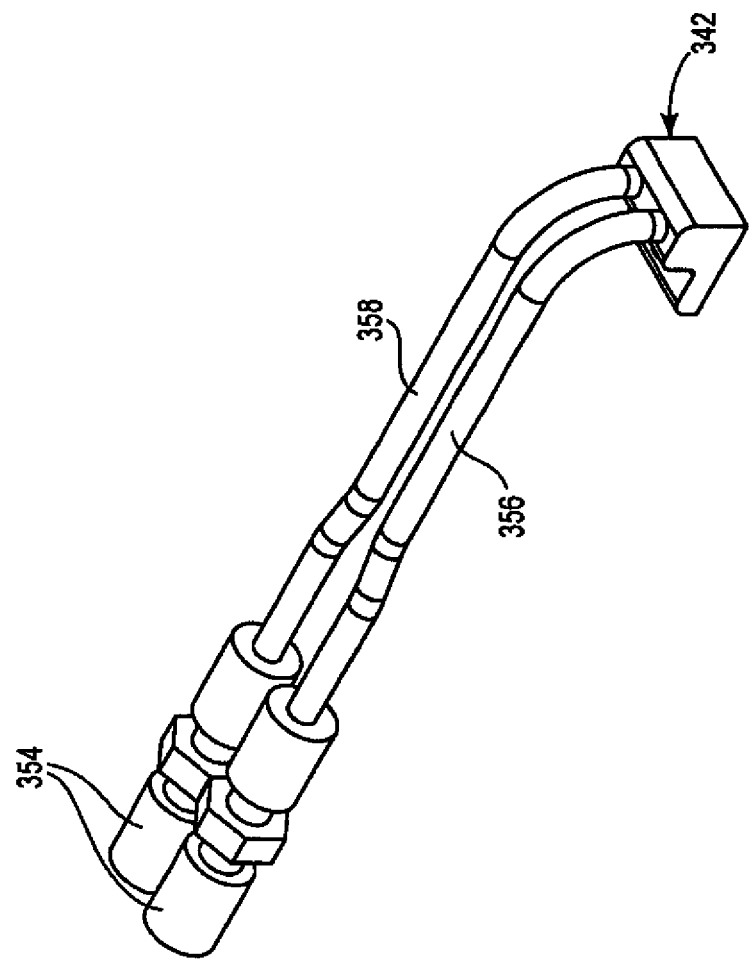
FIG. 9 is a perspective view of plumbing and a plumbing clamp used to supply the rinsing member of the intake assembly with rinsing fluid.

As seen best in FIGS. 4, 6, and 8, floor 270 is recessed relative to the bottom of base member 256. This forms a pocket that fits over and accommodates dispensing components when the intake assembly 200 is mounted in position onto the barrier plate 56 of FIG. 1. To this end, floor 270 includes apertures 272 and 274 that fit over plumbing connections that couple supply lines (not shown) to the spray bar (not shown) integrated into the barrier plate 56 of FIG. 1. Apertures 278 accommodate plumbing connections to a center dispense nozzle assembly (not shown) such as that described in Assignees Co-Pending Applications Nos. 1-4, while aperture 276 accommodates mounting such a center dispense nozzle assembly to floor 270. Aperture 276 provides an accommodation for attaching intake assembly 200 to the spray bar. The attachments through apertures 306 in bottom flange 302 of base member 256, helps hold intake assembly 200 securely in place. Grooves 323 help position and hold gaskets (not shown) that help provide a fluid-tight seal between the intake assembly 200 and the underlying barrier plate structure.

To facilitate uniform wetting of the base member 256 during rinsing operations when using a rinsing liquid such as DI (deionized) water, it is desirable to fabricate base member 256 from hydrophilic material(s). One example of a suitable hydrophilic material can be obtained by irradiating polyphenylene sulfide (PPS), generally a hydrophobic material, with a suitable dosage of ionizing radiation such as ultraviolet radiation, electron beam radiation, or the like. The PPS often has a light yellow color as supplied. A suitable dosage of radiation modifies the color of the PPS to be yellowish-brown without unduly compromising the physical properties of the PPS. Often, the color change is a visual indicator that the surface has been rendered hydrophilic. A simple empirical test can be done by pouring water onto the treated material to see if the water beads up or sheets out. In some instances, a color change may be observed and yet the surface remains hydrophobic. The material can be retreated with the ionizing energy one or more times until the surface becomes hydrophilic.

Figure 12:
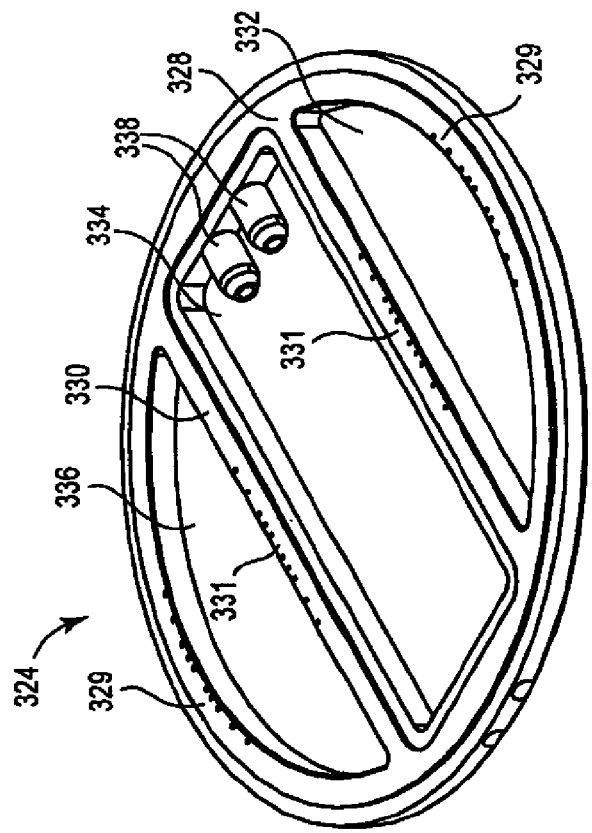
FIG. 12 is a bottom, perspective view of the rinsing member of FIG. 11.
Figure 11:
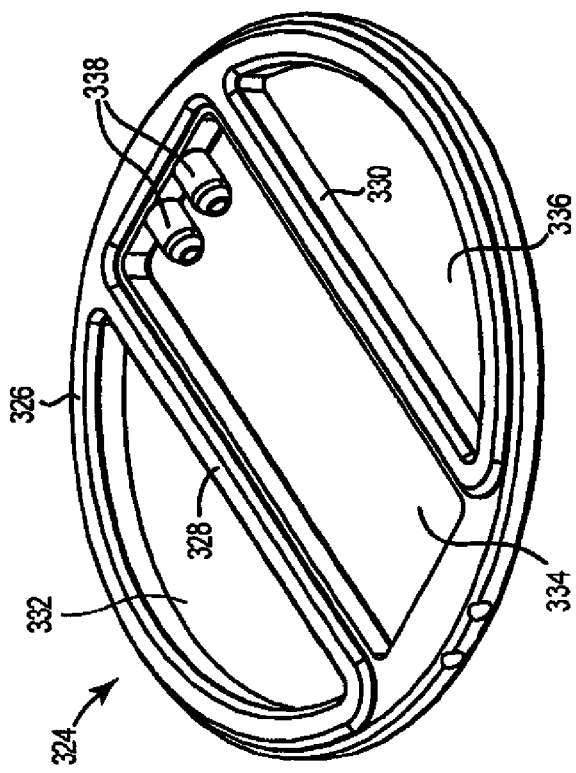
FIG. 11 is a top, perspective view of the rinsing member incorporated into the intake assembly of FIG. 3.
Figure 13:
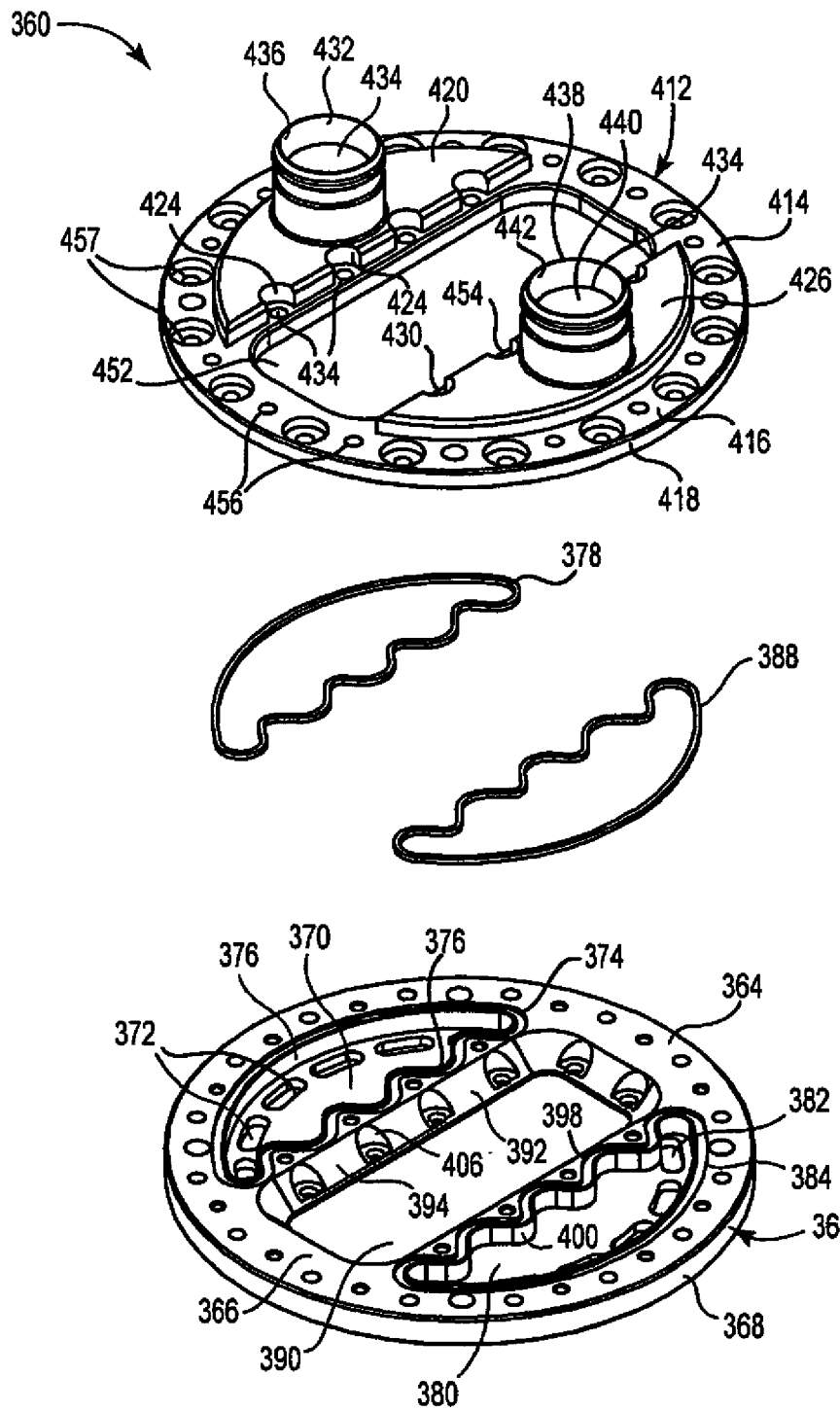
FIG. 13 is an exploded perspective view of the showerhead assembly of FIG. 13.
Figure 15:
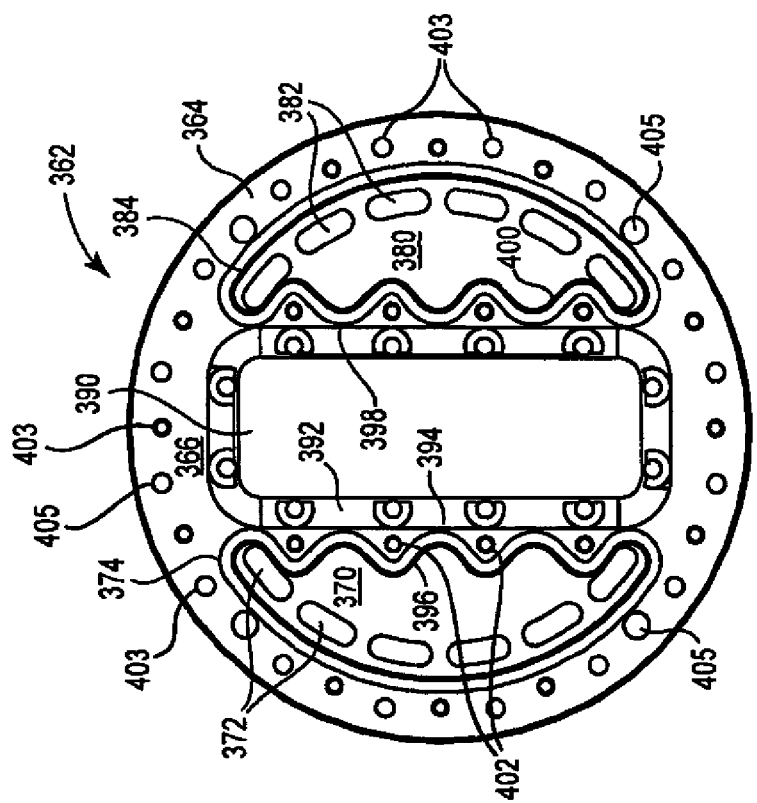
FIG. 15 is a top view of the base of the showerhead assembly of FIG. 14.
Figure 14:
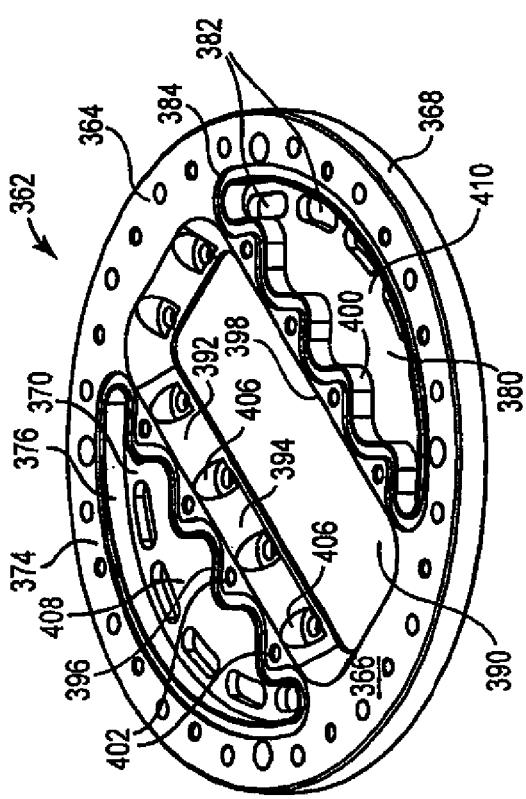
FIG. 14 is a top, perspective view of the base of the showerhead assembly of FIG. 13.
Figures 16, 17:
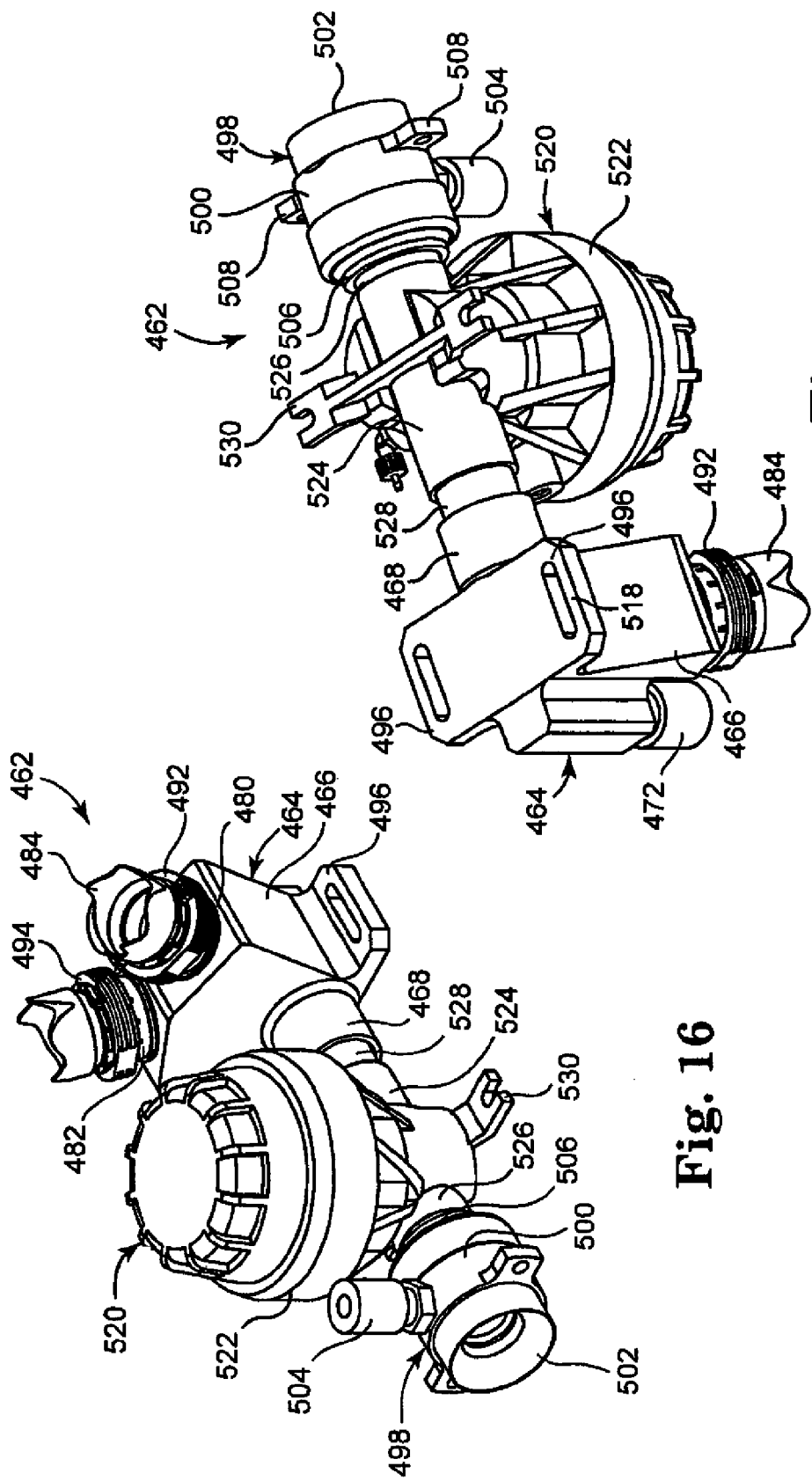
FIG. 16 is a top perspective view of the amplified gas distribution system used in the tool of FIG. 1.
FIG. 17 is a bottom perspective view of the amplified gas distribution system used in the tool of FIG. 1.
Figure 19:
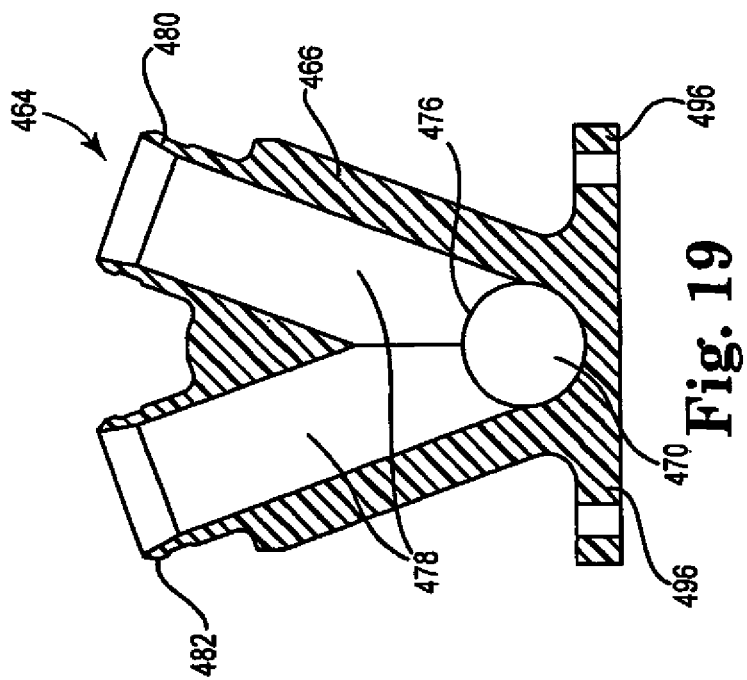
FIG. 19 is a cross-section of the manifold of FIG. 18 showing fluid flow pathways through the manifold.
Figure 18:
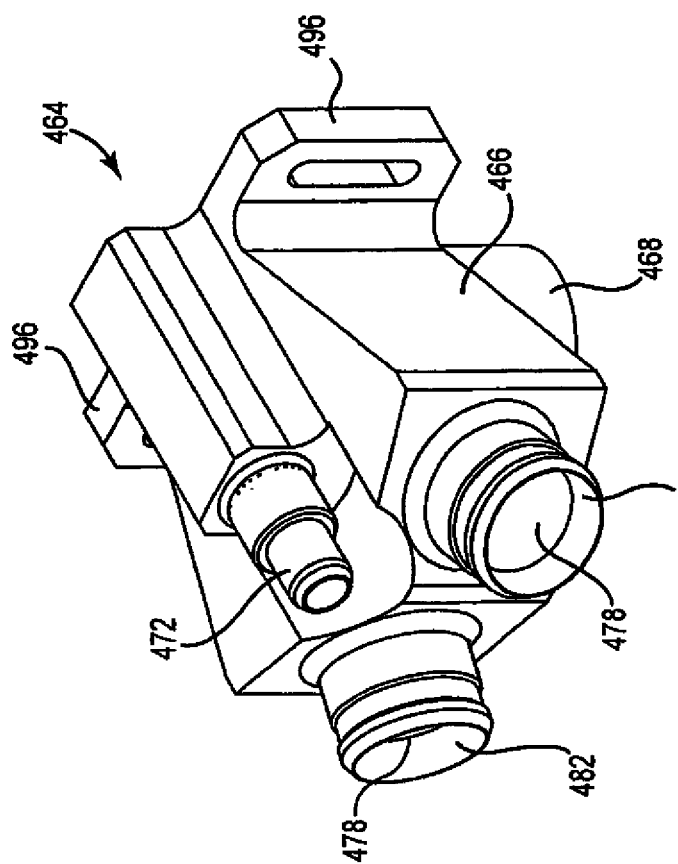
FIG. 18 is a perspective view of the manifold used in the amplified gas distribution system of FIG. 16.

The rinsing member 324 is shown best in FIGS. 11 and 12. In preferred embodiments, rinsing member 324 shown herein is generally identical to the "rinsing member 114" shown and described in detail in Assignee's Co-Pending Application No. 4. As a general overview, rinsing member 324 generally includes a ring-shaped body 326 sized to fit within the rabbets 216, 226, and 244 when top member 202 and base member 256 are fastened together. Arms 328 and 330 extend from one side of ring-shaped body 326 to the other. The resultant structure of rinsing member 324 defines apertures 332, 336, and 338 corresponding to venturi pathways 308 and 316 and central pathway 307, respectively, in the assembled intake assembly 200. The rinsing member 324 is expected to dispense mainly water as a rinsing liquid, and can be made from hydrophobic and/or hydrophilic materials. In one embodiment, the rinsing member 324 is made from polypropylene.

It is preferable that the components of the intake assembly 200 are assembled so as to effectively create a sealed structure, and as such, appropriate gasketing material or sealant can be utilized at appropriate interfaces, as such materials and techniques themselves are well-known. For example gaskets (not shown) are preferably used between the rinsing member 324 and the top member 202. Gaskets (not shown) may also be used between rinsing member 324 and base member 256.

Rinsing member 324 includes fluid distribution features that allow rinsing liquid or other fluids to be introduced to the rinsing member 324 and then controllably dispensed from the rinsing member 324 so as to rinse the base member walls that form the venturi pathways 308 and 316 and the lower surfaces of the barrier plate 56.

To this end, fluids may be introduced to the rinsing member 324 via plumbing connections 338. For dispensing, ring-shaped body 326 includes arrays through 329 of dispensing nozzles that are provided on respective portions of ring-shaped body 326. The nozzles of each array 329 are oriented to dispense fluid directly or indirectly onto inner wall face 262 of base member 58. Additional arrays 331 and 333 of dispensing nozzles are also preferably provided on each arm 328 and 330. These nozzles are oriented to dispense fluid directly or indirectly onto the faces of walls 266 and 268. Further details relating to the internal structure (e.g., fluid passageways), the nozzle orientations, nozzle patterns, and other details of rinsing member 324 are described in Assignee's Co-Pending Application No. 4.

In order to introduce fluid into rinsing member 114, supply tubes 356 and 358 are coupled to plumbing connections 338 with a flare fit using retaining clamp 342. Retaining clamp 342 includes plumbing apertures 344, each having a small end and a large end as described in Assignee's Co-Pending Applications cited herein. The large end fits over the plumbing connections 338, while the small end accommodates the supply tubes 356 and 358. Fastening aperture 350 desirably includes female threads to allow retaining clamp 342 to be securely fastened against an end wall 286 of base member 256 via aperture 252 with good clamping action against the plumbing connections 338. Contour 352 provides room for the fastening hardware used for this. Coupling devices 354 at the top of supply tubes 356 and 358 allow the supply tubes 356 and 358 to be connected to upstream plumbing, not shown.

DI water is a suitable rinsing liquid for use with respect to rinsing member 324. The DI water may be chilled, supplied at ambient, or heated, as desired. Using DI water at ambient temperature (about 19° C. to 26° C.) has been found to be suitable.

The use of dual supply tubes 356 and 358 for supplying rinsing liquid to rinsing member 324 is a desirable option. Depending upon the desired rinsing action, one tube can be used to supply a relatively higher, more vigorous flow of rinsing liquid, while the other tube can be used to supply a lower, less vigorous flow of rinsing liquid. In some modes of practice, both flows can be introduced at the same time for an even greater flow. In one representative mode of practice, introducing DI water at a flow rate of five liters per minute through one of the tubes was found to be suitable for the higher flow rate, while introducing DI water at a flow rate of two liters per minute through the other tube was found to be suitable for the lower flow rate.

A suitable flow control methodology can be used to modulate the degree of flow through each tube 356 and 358. In some modes of practice, valves (not shown) can be either set to be open or closed so that the flow through a particular supply tube is either on or off. This has the advantage of being very simple to implement. In such on or off methodologies, the use of two or more supply tubes as illustrated offers excellent control over rinsing flow rates. In other modes, flow can be regulated so that the amount of flow through one or more supply tubes can be adjusted at any level, or turned off, within a desired range. When practicing these kinds of variable flow methodologies, a single supply tube often would be sufficient to provide excellent control over the rinse flow introduced to rinsing member 324.

Rinsing member 324 provides excellent rinsing action. The nozzles are preferably in close proximity to the surfaces being wetted so that the rinsing fluid can be flowingly dispensed onto these surfaces while minimizing splashing or drops that could lead to workpiece contamination. Advantageously in preferred embodiments, the nozzles are generally inclined toward the surfaces being wetted, have a diverging configuration, such as described in Assignee's Co-Pending Application No. 4, and are desirably positioned very close to the target surface, often being 0.1 mm to 20 mm, more desirably 0.1 mm to 5 mm, and even 1 mm from the target surface. This configuration promotes a smooth delivery of the fluid onto the surfaces being wetted. The dispensing conditions are selected so that splashing and atomization are substantially avoided as much as is practical as the fluid flow comes into contact with the target surfaces. In more desired dispensing conditions, the dispensed streams are poured onto the target surfaces so that the streams flowingly spread out upon reaching the target surfaces. Spreading of the fluid helps the streams wet as much of the surfaces as possible, e.g., wetting of the entire surface is most desirable.

The nozzle pattern is selected to provide minimal overlap, if any, of adjacent streams as this spreading out occurs. Wetting of the full surface via the diverging flows is desirably achieved by the time the flows reach the throat regions 314 and 322 of the venture-shaped pathways 308 and 316, respectively. Achieving full surface coverage at this stage helps promote a further, smooth, sheeting flow of liquid onto and across the lower surface of the barrier structure fluidly coupled to the venturi surfaces. Gas flow accelerating through throat regions 314 and 322 further promotes spreading and thinning of the liquid flow on the lower surface of the barrier structure.

When dispensing water onto the hydrophilic surfaces of the venturi pathway walls, excellent sheeting action and coverage of the hydrophilic surfaces is observed with very little splashing or droplet formation. As the rinsing liquid moves out of the venturi pathway onto the adjacent, hydrophilic lower surface of the barrier plate, the sheets of flowing rinsing liquid smoothly and uniformly sheet over and cover the lower, hydrophilic surface of the barrier plate. As the rinsing liquid flows outward toward the outer periphery of the barrier plate, aspiration techniques desirably are used to collect at least some of the rinse liquid as described in Assignee's Co-Pending Application No. 3. Aspiration may occur while rinsing and/or at the end of rinsing.

The position of the rinsing member 324 indicates that the rinsing liquid is introduced onto the surfaces defining venturi pathways 308 and 316 above the throat regions 314 and 322. By introducing liquid from nozzles positioned higher up in the pathways 308 and 316 like this, and by being positioned close to the walls of the pathways 308 and 316, the nozzle structures have a de minimis impact upon fluid flow moving through the adjacent pathways. If the nozzle structures happen to capture moisture, drips tend to flow down the surfaces rather than fall downward into the chamber where contamination of workpieces otherwise might be a greater risk.

Being positioned above the throat regions 314 and 322, the nozzle structures also are outside the containment boundary provided by these throats. This helps to protect the nozzle structures from contamination. This also allows the rinse to reach all surfaces likely to bear residual chemicals. As an additional advantage, it is easier to develop and implement a diverging fluid flow that achieves excellent surface wetting. If the nozzles were to be positioned below the throat regions, the angles incorporated into the diverging nozzle pattern would be more critical and subject to stricter tolerances in order to be effective. All in all, these numerous features and benefits associated with the rinsing member 324 and the nozzle arrays integrated into the rinsing member provide dramatically reduced particle contamination.

In illustrative modes of practice for carrying out rinsing operations using rinsing member 324, the hydrophilic portions of the venturi pathways below the rinsing member 324 and the hydrophilic lower surface of the barrier plate are pre-wetted with rinsing liquid before introducing a workpiece into the process chamber. Because the rinse is flowingly distributed onto these surfaces, splashing and droplets that can lead to particle contamination are substantially avoided. Pre-wetting also helps to ensure that these hydrophilic surfaces have been rinsed thoroughly and are uniformly wetted. Prior to introducing a workpiece, the hydrophilic surfaces may be dried if desired, but it is often convenient and shortens cycle time to leave the surfaces wet. Because the wetted surfaces are hydrophilic, discrete droplets tend not to form on these surfaces, and a workpiece can be loaded, processed, and unloaded with de minimis, if any, contamination. Rinsing of the venturi pathways and barrier plate thus may occur prior to a chemical treatment step. Rinsing also may occur between chemical processing steps and/or during these steps. The nozzles of the rinsing member 324 may be aspirated to suck back residual liquid at the end of a rinsing dispense to avoid drips.

Initial wetting of the hydrophilic surfaces generally requires more rinse liquid than maintaining the flow once established. Accordingly, rinse liquid delivery may be modulated to recognize this effect. For instance, after wetting is established, the rinse water can thereafter be introduced at a lesser flow. Flow may be reduced in a pulsed fashion, such as by opening and closing valves. The pulsing frequency and duration would be selected to maintain the desired flowrate profile while offering a lower overall consumption of rinsing liquid. Additionally, pulsing the rinsing liquid on and off may better wet and wash the hydrophilic surfaces via the associated surges of each flow pulse.

Showerhead dispense member 360 is mounted to the upper face 248 of top flange 246 and the top faces of walls 210 and 220 of the intake assembly 200. Showerhead dispense member 360 is shown in more detail in FIGS. 1, 2, and 13-15. To help create a fluid tight seal into the venturi-shaped pathways 308 and 316, gaskets (not shown) may be positioned in grooves 236 on the top of the intake assembly 200. Showerhead dispense member 360 includes features that include additional portions of the environmentally controlled fluid pathways that are upstream from the corresponding venturi pathways 308 and 316, respectively. The showerhead dispense member 360 is useful to help establish more uniform flows of one or more gases and/or vapors into the processing chamber 18. For purposes of illustration, showerhead dispense member 360 is fed by two supply tubes 444 and 448, which may be coupled to the same and/or independent supply sources, thus allowing two different treatment materials to be dispensed into processing chamber 18 at the same time. Of course, other embodiments may include only a single supply feed or three or more feeds, as desired. In the illustrated embodiment, the supply tubes 444 and 448 are both coupled to the amplified gas distribution station 462, to be described further below.

Showerhead dispense member 360 generally includes bottom 362 and cover 412. Bottom 362 generally includes panel 364 having upper face 366. Rim 368 projects downward from the outer periphery of the panel 364 to help stiffen and strengthen bottom 362. Sidewall 376 interconnects panel 364 with a first recessed floor 370 positioned below the panel 364. The recessed floor 370 and the sidewall 376 help to define a bottom portion 408 of a first internal chamber of the showerhead dispense member 360, which constitutes a portion of an environmentally controlled fluid pathway including pathway portions that extend through the showerhead dispense member 360. Elongated apertures 372 are provided in the recessed floor 370. The elongated apertures 372 open into the downstream first venturi pathway 308 of the intake assembly 200. A groove 374 holds gasket 378 to help provide a fluid tight seal between bottom 362 and cover 412. A portion of sidewall 376 has undulating contours to maximize the volume of chamber portion 408, while still leaving room on upper face 366 for apertures 402 used to fasten bottom 362 to cover 412.

Similarly, a sidewall interconnects panel 364 with a second recessed floor 380 positioned below the panel 364. The recessed floor 380 and the sidewall 400 help to define a bottom chamber portion 410 of a second internal chamber of the showerhead dispense member 360, which constitutes a portion of another environmentally controlled fluid pathway. Elongated apertures 382 are provided in the recessed floor 380. The elongated apertures 382 open into the downstream second venturi pathway 316 of the intake assembly 200. The relatively large size of the elongated apertures 372 and 382 allow the showerhead dispense member 360 to easily handle relatively high volume flows of amplified air and/or other gases supplied from the upstream amplified gas distribution station 462. A groove 384 holds gasket 388 to help provide a fluid tight seal between bottom 362 and cover 412. A portion of sidewall 400 has undulating contours to maximize the volume of the bottom chamber portion 410, while still leaving room on upper face 366 for apertures 402 used to fasten bottom 362 to cover 412. Additional apertures 403 around the periphery of the panel 364 also are used for fasteners to assemble the bottom 362 and cover 412 of the showerhead dispense member 360. Further additional apertures 405 around the periphery of the panel 364 are used for fasteners to secure the showerhead dispense member 360 to the intake assembly 200. The apertures 403 and 405 align with corresponding apertures 455 and 457, respectively, on the outer periphery of the cover 412.

The panel 364 has a generally rectilinear central aperture 390 sized to fit over and align with the underlying central through aperture 230 of the intake assembly 200. The central aperture 390, therefore, also provides a portion of the convenient pathway 307 for leading plumbing, electrical, and other components through the showerhead dispense assembly 360. Beveled sidewalls 392 defining the boundaries of the central aperture 390 include contours 406 to make room to use fasteners in apertures 404 to mount the showerhead dispense member 360 to the intake assembly 200.

Cover 412 generally includes a circular panel 414 and an annular rim 418 extending from the periphery of the panel 414, strengthening and stiffening the cover 412. A first raised cover region 420 overlies the first recessed floor 370 and defines a top portion 422 of the first chamber inside the showerhead dispense member 360. First raised cover region 420 includes contours 424 to make room to use fasteners in apertures 454 and apertures 402 when assembling bottom 362 and cover 412. A second raised cover region 426 overlies the second recessed floor 380 and defines a top portion 428 of the second chamber inside the showerhead dispense member 360. Second raised cover region 426 includes contours 430 to make room to use fasteners in apertures 454 and apertures 455 when assembling bottom 362 and cover 412. Central aperture 452 overlies central aperture 390 of bottom 362, also helping to provide a portion of the convenient pathway 307 for leading plumbing and other components through the center of the showerhead dispense member 360.

One or more treatment materials, typically gases and/or vapors, may be supplied to showerhead dispense member 360 via fluid inlet members 432 and/or 438. One or more of these fluid(s) enter the fluid inlet member 432 at inlet 436 and flow into the downstream chamber of showerhead dispense member 360 via conduit 434. Similarly, one or more of these fluids enter the fluid inlet member 438 at inlet 442 and flow into the downstream chamber of showerhead dispense member 360 via conduit 440. A first supply tube 444 is coupled to first fluid inlet number 432 by suitable hardware 446 (see FIG. 2), and a second supply tube 448 is coupled to the second fluid inlet member 438 by suitable hardware 450 (see FIG. 2).

In use, one or more treatment fluids, especially one or more flows of gas(es), are supplied to showerhead dispense member 360 via first and/or second supply tubes 444 and 448. The treatment fluids supplied to each tube may be the same or different. The treatment fluids are introduced into the corresponding chambers of the showerhead dispense member 360 via conduits 434 and 440, respectively. The pressure of the treatment fluid(s) within the chambers is generally equalized so that the flow through the elongated apertures 372 and 382 is uniform. Desirably, the pressure differential of the fluid(s) within the showerhead chambers is desirably less than pressure drop through the apertures 372 and 382 themselves in accordance with conventional practices to promote such uniform flow. When dispensed through the elongated apertures 372 and 382, the dispensed fluid(s) generally flow towards process chamber through the venturi shaped pathways 308 and 316, respectively.

Referring to FIGS. 1 and 16 through 21, amplified gas distribution station 462 is upstream from the showerhead dispense member 360. The showerhead dispense member 360 is fluidly coupled to the amplified gas distribution station 462 by plumbing including at least the first and second supply tubes 444 and 448. On demand, the amplified gas distribution station 462 fluidly controllably couples the process chamber 18 to at least one source of ambient air and at least one non-ambient source of a fluid that can be sourced independent of the ambient air such as a gas, vapor, combination of these or the like. Examples of such other gases and vapors include nitrogen, argon, carbon dioxide, combinations of these, and the like.

In preferred embodiments, amplified gas distribution station 462 is fluidly coupled to a source of ambient air in the robotics compartment associated with tool 10. This is advantageous because such air is often purified to an extremely high degree, even higher than a surrounding clean room ambient external to tool 10. This allows the amplified gas distribution station 462 to draw ambient air from a substantially particle free environment for very pure processing of microelectronic workpieces. Additionally, this conveniently places the station 462 in relative close proximity to the process chamber(s) served by the station. Of course, the amplified gas distribution station 462 can be placed in other locations as desired so long as a suitable source of ambient air is practically accessible. Other representative candidate locations include other compartments of the tool 10, the surrounding clean room, other tools in the local clean room, or even distant tools or clean rooms. If the air intake of the air amplifier 498 is fitted with appropriate purification componentry, the air amplifier 498 can even be fluidly coupled to other sources of ambient air that would be purified at least partially upon entering the air amplifier 498 through such componentry. For purposes of illustration, amplified gas distribution station 462 is shown as also being coupled to a nitrogen source that can be sourced independently of the ambient air. Even though the process chamber 18 is shown as being serviced by a single air amplifier 498, more than one air amplifier may serve one or more process chambers in other embodiments.

In more detail, amplified gas distribution station 462 generally includes a manifold 464, and air amplifier 498, and valve 520 interposed between the manifold 464 and the air amplifier 498. Manifold 464 includes body 466 having features that allow the manifold 464 to receive fluids from multiple sources and then distribute such fluids to one or more downstream destinations such as supply lines 444 and 448, showerhead dispense member 362, intake assembly 200, and process chamber 18. For receiving a supply of amplified air from air amplifier 498, body 466 includes amplified air inlet 468 fluidly coupled to first and second outlets 480 and 482 by amplified air channel 470, juncture 476, and bifurcated outlet channels 478. For receiving an independent supply of nitrogen gas from a nitrogen supply (not shown), body 466 includes pressurized gas inlet 472 fluidly coupled to first and second outlets 480 and 482 by pressurized gas channel 474, juncture 476, and bifurcated outlet channels 478. First and second supply tubes 484 and 488 fluidly couple manifold 464 to showerhead dispense member 360. First and second supply tubes 484 and 488 may be the same or different as first and second supply tubes 444 and 448, respectively. First and second supply tubes 484 and 488 are secured to manifold 464 using suitable hardware 492 and 494. Mounting tabs 496 may be used to mount amplified gas distribution station 462 in a desired location such as on a housing, framework, or the like.

Air amplifier 498 supplies manifolds 464, and hence the process chamber 18 with an amplified flow of air on demand. An air amplifier refers to a device that uses a relatively low flow of pressurized gas to generate a much larger flow of a relatively lower pressure gas. In many instances, the lower pressure gas is the ambient air. An air amplifier device takes energy from a small volume of pressurized gas to produce a high velocity, high-volume, low-pressure output airflow. Amplification ratios in the range of from greater than 1 to as much as 75:1 are achieved in many commercially available units. In the present invention amplification ratios in the range from greater than one to about 25:1 preferably from greater than about two to about 10:1 would be suitable. Under one set of conditions, using an amplification ratio of 4:1 was found to be suitable.

Air amplifier 498 includes body 500, air intake 502, pressurized gas inlet 504 coupled to a source of pressurized gas (not shown) such as nitrogen, amplified air outlet 506, and mounting tabs 508. In use, the pressurized gas is introduced into pressurized gas inlet 504. Due to the internal structure of the air amplifier, the pressurized gas both pulls a much larger volume of ambient air into the air amplifier 498 through air intake 502 while also pushing ambient air in front downstream toward manifold 464.

Figure 21:
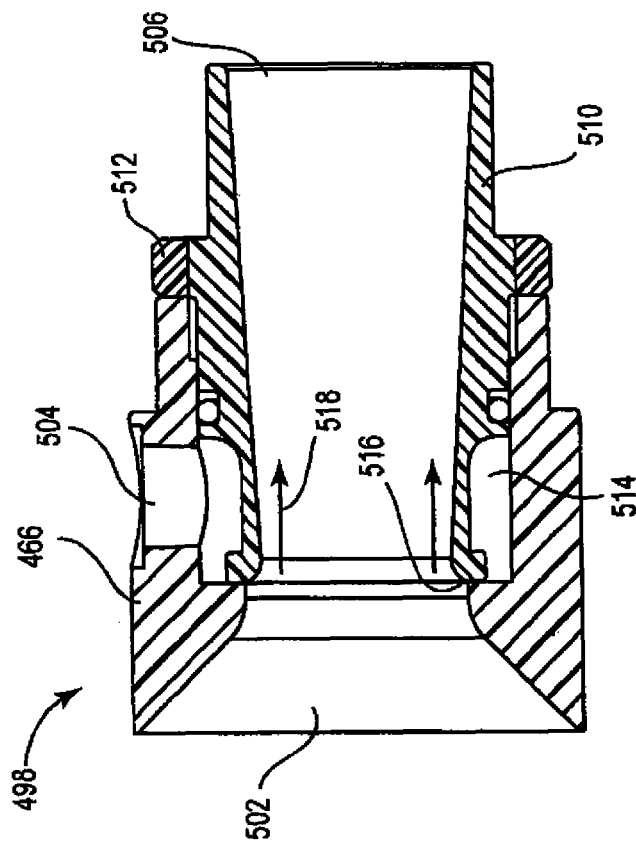
FIG. 21 is a cross-section of the air amplifier used in the amplified gas distribution system of FIG. 16.
Figure 20:
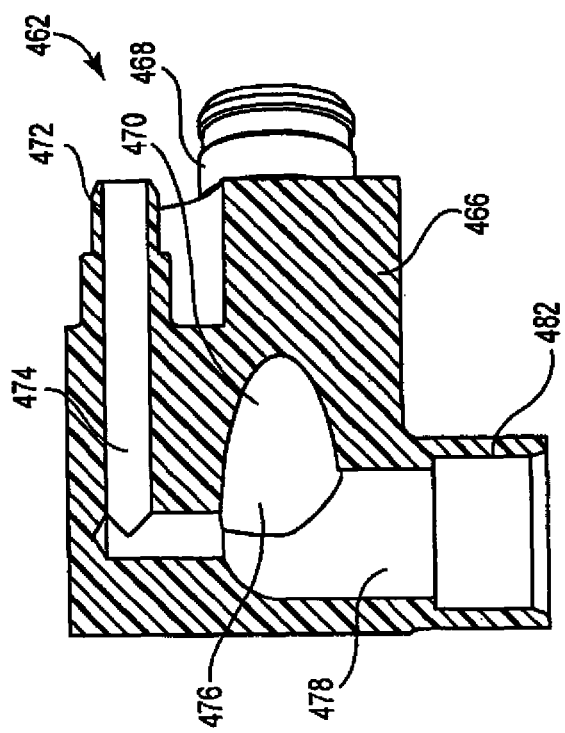
FIG. 20 is another cross-section of the manifold of FIG. 18 showing fluid flow pathways through the manifold.
Figure 22:
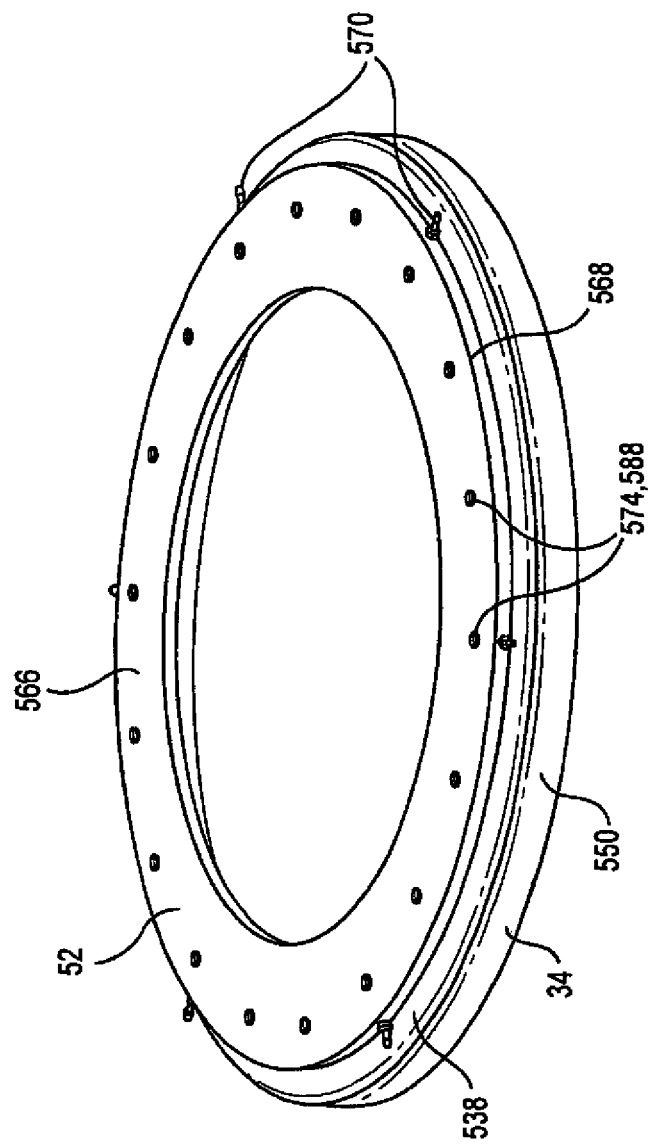
FIG. 22 is a top perspective view of a ring-shaped, gas generating member mounted onto the top of a baffle member.
Figure 23:
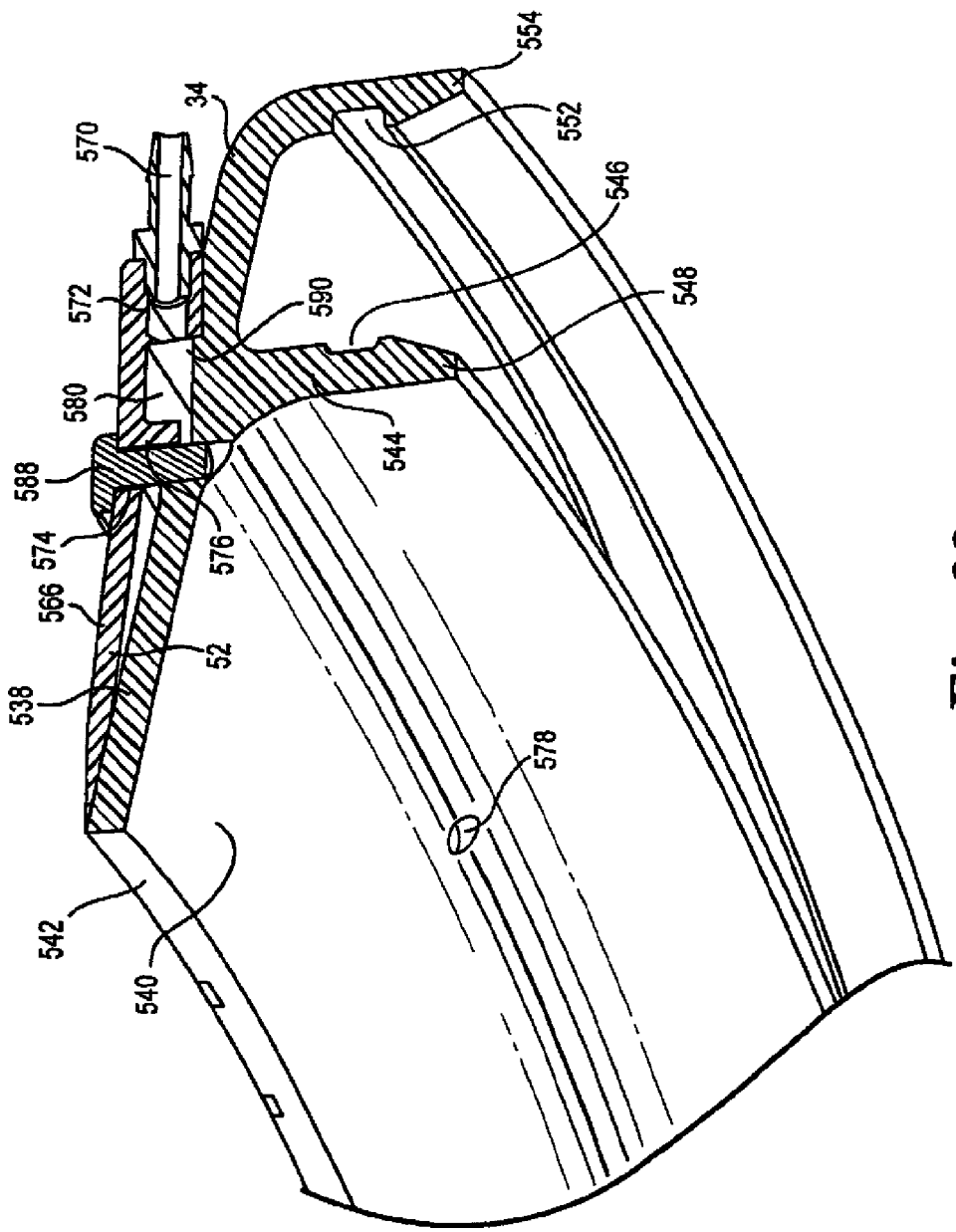
FIG. 23 is a close-up perspective view, shown in cross-section of a portion of the assembly shown in FIG. 22.
Figure 24:
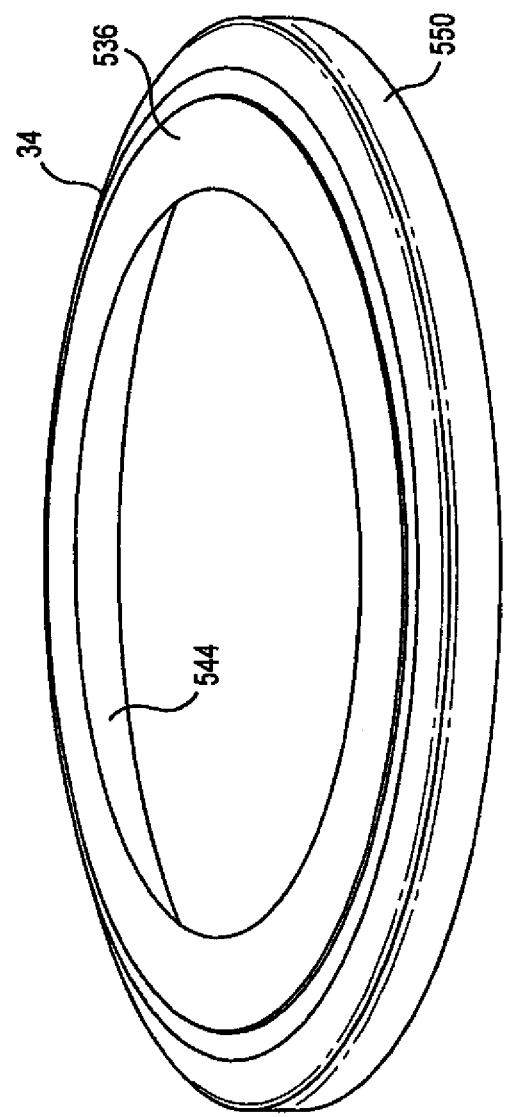
FIG. 24 is a top perspective view of the baffle member of FIG. 22.
Figure 25:
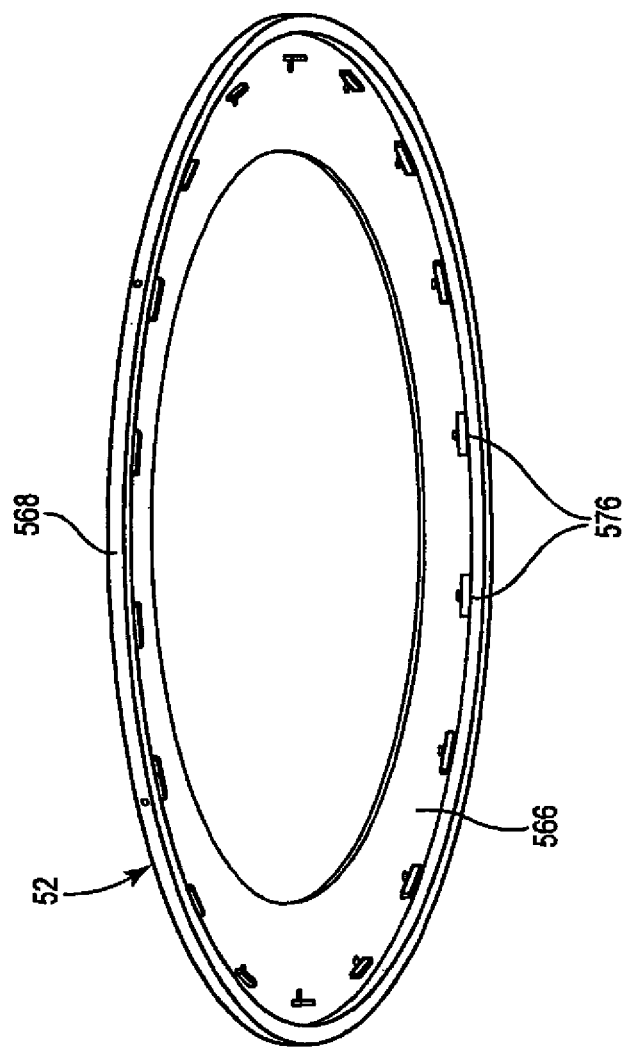
FIG. 25 is a bottom perspective view of the ring-shaped member of FIG. 22.
Figure 26:
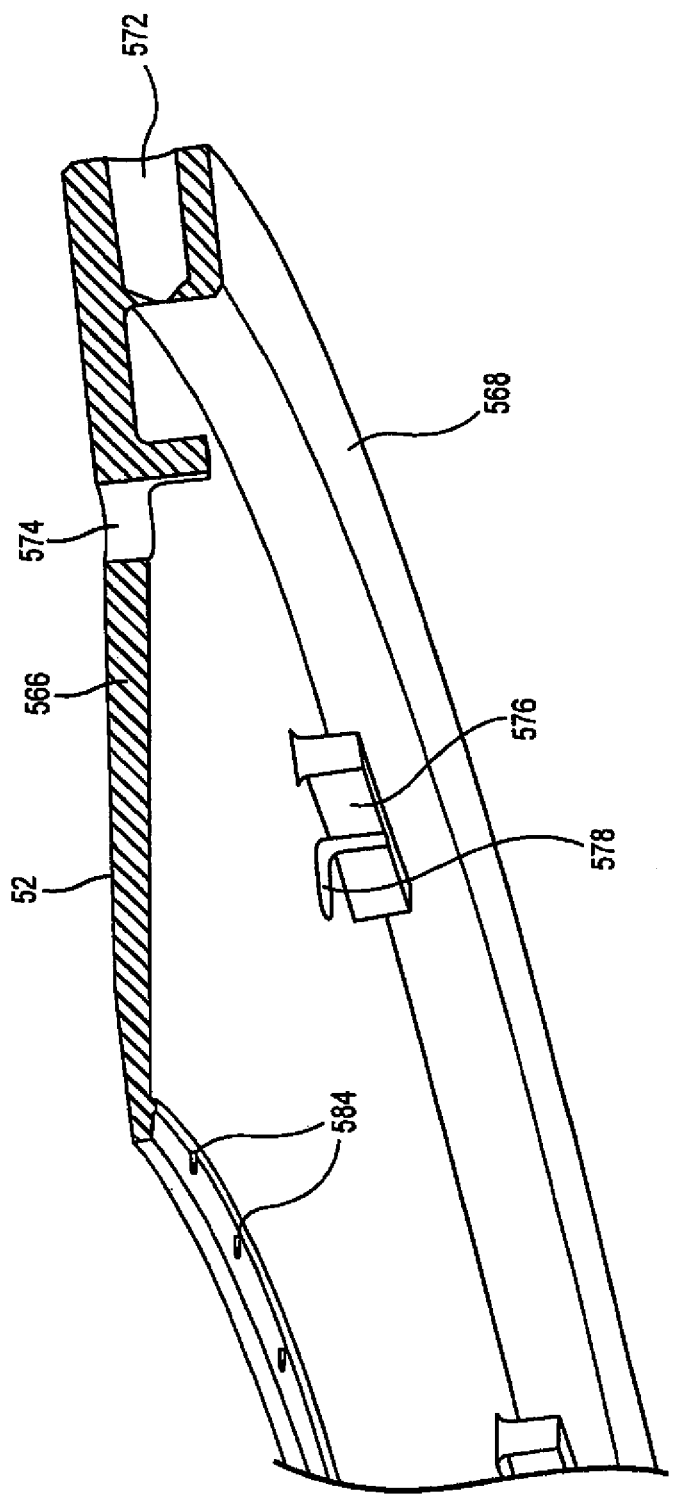
FIG. 26 is a close-up perspective view of a portion of the ring-shaped member of FIG. 22.
Figure 27:
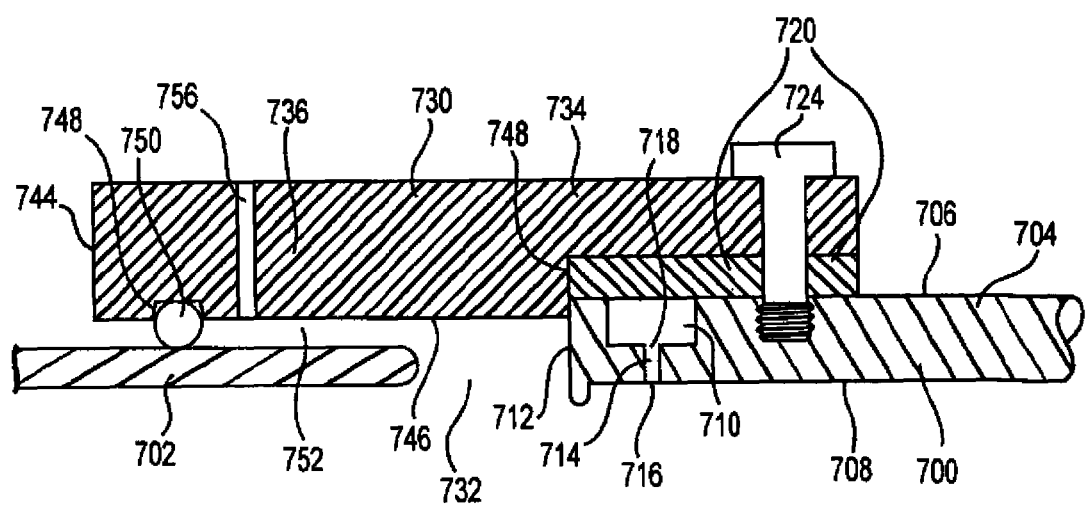
FIG. 27 schematically shows a hybrid technique for sealing a gap between a barrier plate and an adjacent baffle member using both a gas flow and physical contact to establish a seal.
Figure 28:
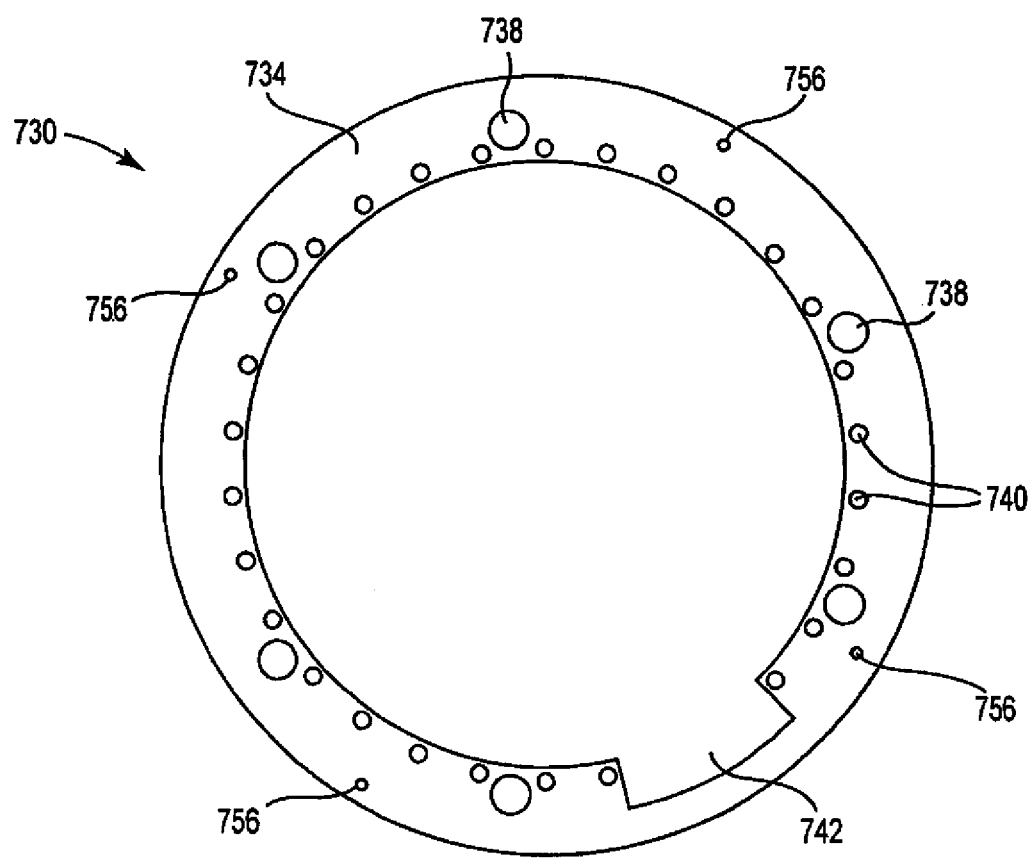
FIG. 28 shows a top view of the ring-shaped member used in FIG. 27 to help seal the gap.
Figure 29:
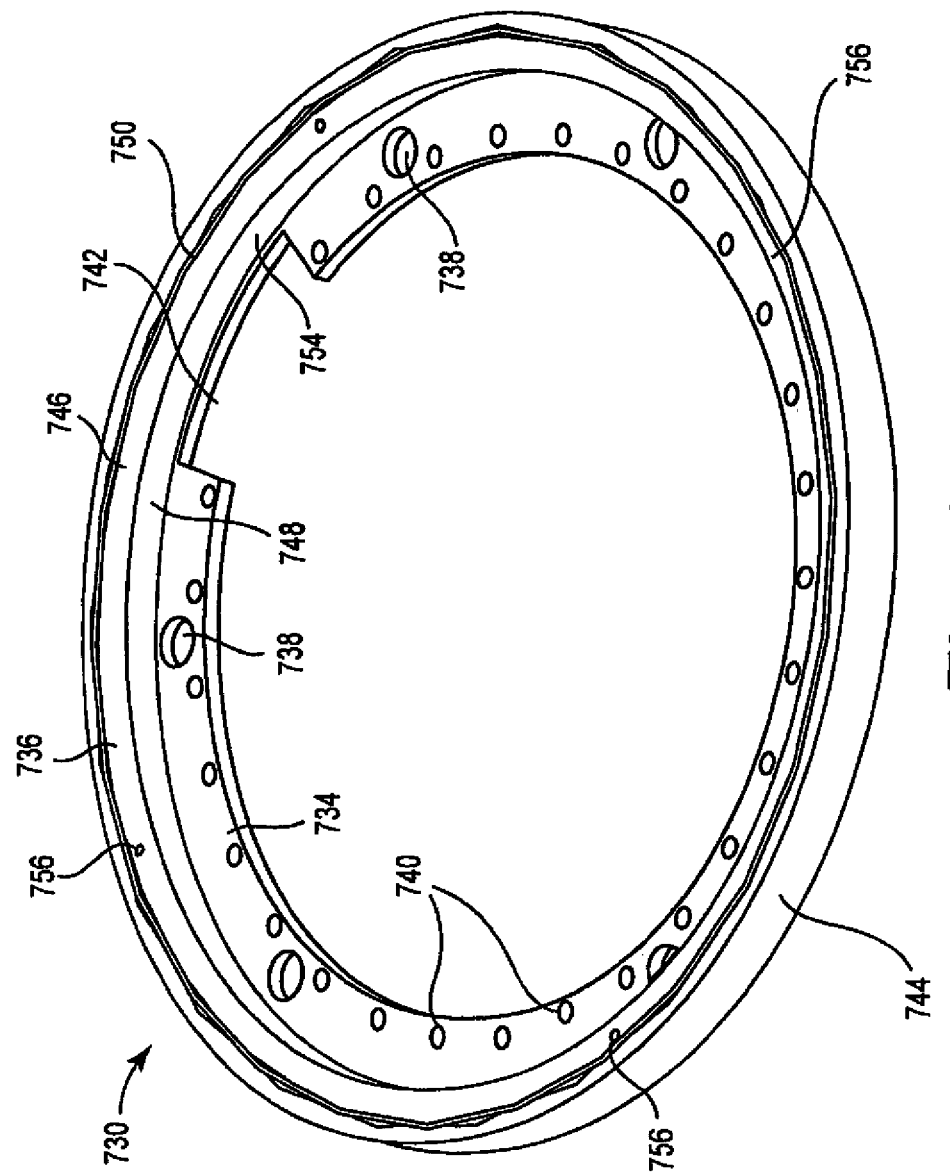
FIG. 29 shows a bottom perspective view of the ring-shaped member used in FIG. 27.
Figure 30:
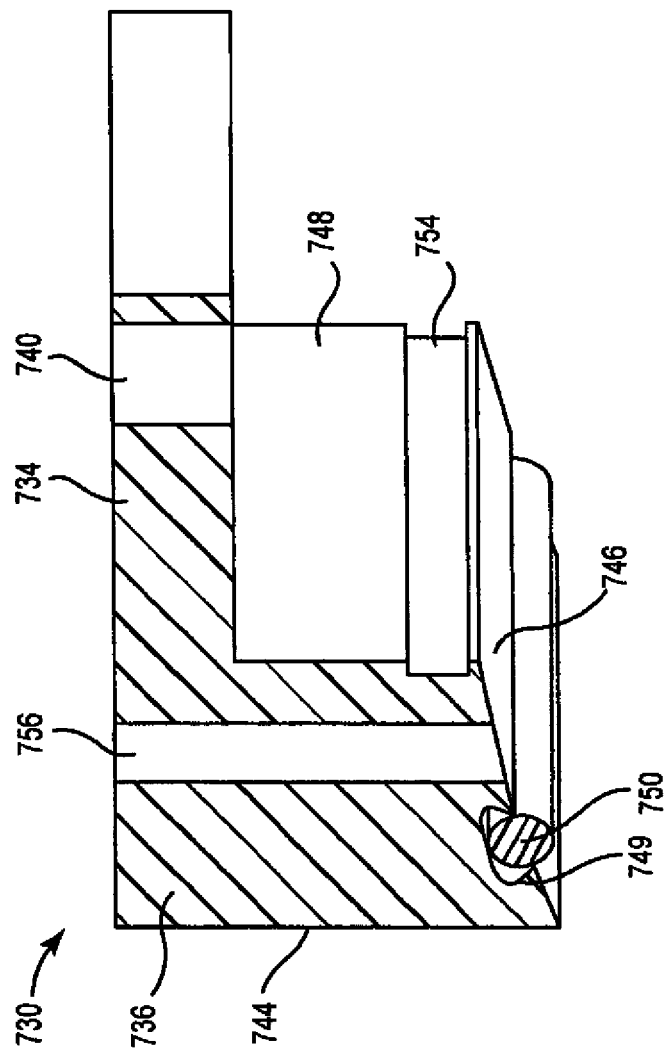
FIG. 30 shows a close-up perspective view of a portion of the ring-shaped member of FIG. 27 shown in cross-section.

FIG. 21 shows additional features of air amplifier 498 and how air amplifier 498 operates. The body 500 of air amplifier 498 is generally formed from main body member 501, adjustable core 510, and locknut 512. Pressurized gas flows from compressed gas inlet 504 into the annular chamber 514. The flow of pressurized gas is then throttled by annular gap 516. This results in a high velocity flow that adheres to the so-called Coanda profile, directing the flow toward the manifold 464. This creates a low pressure area at the air intake 502. This draws in a high-volume of surrounding air from the ambient, producing a high-volume, high velocity output flow through the amplified air outlet 506.

A particularly preferred embodiment of an air amplifier is the model No. 40001 adjustable air amplifier commercially available from NEX except that the stainless steel locking nut provided with the commercially available unit is replaced with a locking nut manufactured from PVDF. The PVDF nut is substituted in order to cover and protect the stainless steel from chemical exposure. In other embodiments, additional components of the air amplifier, or even the entire air amplifier can be made from PVDF, PTFE, and/or other inert material(s).

The use of the air amplifier 498 in this context provides many advantages. Firstly, the air amplifier 498 makes it very easy to isolate or couple the process chamber 18 to the ambient air on demand by simple actuation of valve 520 to open or block access to the air amplifier 498. The transition between open and closed modes of operation is very fast via such valve actuation, and the air amplifier 498 can draw in a substantial flow of ambient air on demand. In particular, the design makes it easy to pull oxygen from the ambient into an otherwise closed chamber design.

Another advantage relates to the positioning of the air amplifier upstream from the process chamber 18. By inducing the airflow from this upstream position, the tool 10 has a greater degree of control over the flow rate of ambient air into the chamber 18 than if the airflow was induced solely by pulling an exhaust downstream from the process chamber 18. The flow uniformity of air pulled into the process chamber 18 solely by a downstream exhaust can be impacted to a much larger degree by events within the process chamber, such as the rpm at which the chuck is spinning, the rate at which treatment media are introduced into the chamber, the size of the spinning wafer, and the like. In contrast, the flows generated by an upstream air amplifier are generally isolated by the events in the downstream chamber, and thus are more uniform. When only a downstream exhaust is used, process consistency can suffer. Of course, when using an air amplifier a downstream exhaust can still be pulled. However, such an exhaust can be more moderate since the exhaust might be used in many embodiments to evacuate the chamber and not to supply the chamber with ambient air.

As another advantage, the air amplifier 498 can generate air flows without any movement of air amplifier components needed to initiate or sustain a generated flow. This minimizes the risk of generating particles associated with hardware having moving components. This is particularly advantageous in the context of microelectronic fabrication where minimizing particle contamination is paramount.

The valve 520 includes a belt body 522, a conduit region 524 through which an amplified flow of air flows from the air amplifier 498 to the manifold 464 wherein this conduit region 524 can be open or choked via valve actuation, an inlet 526 through which amplified air enters the valve 520, an outlet 528 through which amplified air exits the valve 520 to the manifold 464, and mounting tabs 508. Preferably, the valve 520 is normally closed so that, in the event of a power failure, the exposure of the downstream process chamber 18 to the ambient via is blocked.

FIGS. 1 and 22 through 26 show in more detail how the curtain 50 of flowing gas can be used to establish a barrier across a gap between the process chamber cover in the form of the barrier plate 56 and the adjacent moveable barrier in the form of the baffle member 34. As shown in these Figures, the gap 48 exists between the outer periphery of the barrier plate 56 and the inner rim 68 of the baffle member 34. When the tool 10 is operated in a closed mode of operation, such as a treatment of workpiece 12 in which oxygen from the ambient or other sources is to be excluded from the process chamber 18, it is desirable to block this gap 48 so that oxygen cannot gain egress into the process chamber 18 through this gap 48.

The baffle member 34 generally includes annular baffle plate 536, upper surface 538, lower surface 540, inner periphery 68, inner sidewall flange 544, and outer sidewall flange 550. The flanges 544 and 550 include grooves 546 and 552 and tapered tips 548 and 554 to facilitate snapping onto a corresponding baffle hood (not shown) of the type shown in Assignee's Co-Pending Applications Nos. 1 and 2. Baffle member 34 can be moved up and down to open or choke the exhaust duct 40 of FIG. 1. The up and down movement of the baffle member 34 can also facilitate loading and unloading of the wafer 12. The gap 48 exists between the inner rim 68 of the baffle member 34 and the sidewall 560 of the barrier plate 56. In a typical instance, the width of this gap is about 1/16 inches (about 1.6 mm).

Member 52 in the form of a gas ejector ring is mounted onto the upper surface 538 of baffle member 34 in a position to eject an annular curtain 50 of gas at the sidewall 560 of the barrier plate 56. Member 52 generally includes panel 566 and rim 568 projecting downward from panel 566 to strengthen and stiffen the ring 52. Gas inlet nozzles 570 are threadably inserted into inlet apertures 572. A source (not shown) of a suitable pressurized gas such as nitrogen or the like is fluidly coupled to the nozzles 570 by tubing (not shown) or other suitable plumbing. Pressurized gas is introduced to the member 52 through nozzles 570. The gas is then distributed around the plenum 580 between the ring 52 and the baffle plate 536. The gas is then ejected radially inward toward the face of the sidewall 560 of the barrier plate 56 through the annular nozzle 586 proximal to the inner rim 68 of the baffle member 34. Fasteners 588 fit through apertures 574 to secure the ring-shaped member 52 to threaded apertures 578 of baffle member 34. As shown, the threaded apertures 578 are tapped all the way through baffle plate 536, but these may be tapped only partially through the baffle plate 536. As another positioning alternative, the apertures 578 may be tapped over the inner sidewall flange 544 to provide more depth for seating the fasteners 588. Spacers 576 at the fastener locations help to support the panel 566 and maintain the volume of the plenum 580 when driving the fasteners 588. Standoffs 584 at the mouth of the annular nozzle 586 help to maintain the uniformity of the nozzle width. In a typical embodiment, the nozzle width is about 5/1000 inches. The top surface of the baffle plate 536 is stepped down in the plenum region in order to help create more volume in plenum 580. A shoulder 590 on the baffle plate 536 also helps to locate the member 52 for mounting.

The Figures above show how a gas curtain by itself can be used to create a seal across a gap between two independently moving components. In the case of the Figures above, these moving components were barrier plate 56 and member 52. As an alternative, FIGS. 27 to 30 show how a gas curtain in combination with physical contact can be used to create an effective seal between moving components. The sealing strategy is hybrid in the sense that both gas and physical tactics are used to accomplish sealing. One advantage of such a hybrid strategy is that the manufacturing tolerances between the moving components are eased, because the gas curtain can help to enhance the quality of the physical seal in one or more region(s).

Specifically, FIGS. 27 to 30 show how a hybrid sealing strategy may be accomplished in the context of moving components including a barrier plate 700 and a moveable baffle member 702. Representative embodiments of the barrier plate 700 and the moveable baffle member 702 are described in Assignee's Co-Pending Applications Nos. 1 through 4. The barrier plate 700 includes an annular body 704 (a portion of which is shown schematically in FIG. 27) with a top surface 706 and a lower surface 708.

As part of the aspiration system incorporated into barrier plate 700, an annular trough 710 is formed in top surface 706 proximal to the outer periphery 712 of annular body 704. Aspirating channels 714 extend between ports 716 located on the lower surface 708 of annular body 704 to corresponding ports 718 opening into trough 710. Seal ring 720 is fastened to annular body 704 over trough 710 to seal the top opening of trough 710. Seal ring 720 may be secured to annular body 704 in any convenient fashion. By way of example, seal ring 720 includes an array of apertures that allow seal ring 720 to be secured over trough 710 by fasteners 724 that engage threaded bores in the top surface 706 of annular body 704.

The seal ring 720 is generally annularly shaped with a notch (not shown) through the ring defining ends to make room for spray bar components as described in Assignee's Co-Pending Applications Nos. 1 through 4. Additionally, seal ring 720 is provided with egress holes (not shown) that provide egress for plumbing components to access trough 710. This allows a vacuum to be pulled on trough 710. The vacuum helps to pull liquid material from the lower surface 708 into trough 710 via aspiration channels 714. Advantageously, perimeter aspiration helps to keep the bottom of barrier plate 700 clean and dry and also helps to prevent defects on an underlying workpiece that might otherwise arise from drips or particles.

Annular shaped member 730 is physically attached to barrier plate 700 and helps to establish a hybrid seal across the gap 732 between the barrier plate 700 and the baffle member 702. Member 730 includes a generally ring-shaped panel 734 and a rim 736 extending downward from panel 734. Panel 734 includes a plurality of relatively large apertures 738 that serve as pass-throughs to allow aspiration tubing to access the barrier plate 700. Relatively small apertures 740 are used to secure member 730 to barrier plate 700 using fasteners 724. Cut out region 742 provides room for the member 730 to fit over spray bar and related components as described in Assignee's Co-Pending Applications Nos. 1 through 4 and particularly as described in Assignee's Co-Pending Application No. 3.

Rim 736 has an outer face 744, a bottom face 746, and an inner face 748. The lower face is angled to generally match the slope of the underlying baffle member 702. However, when the gap 732 is sealed, the bottom face 746 preferably does not directly contact the surface of the underlying baffle member 702. More desirably, the bottom face 746 is separated from the baffle member 702 by a small gap 752 having a thickness in the range from about 0.0005 to about 0.01 inches, more desirably from about 0.002 to about 0.005 inches. The bottom surface 746 has an annular groove 749 housing a compressible gasket 750. When gap 732 is sealed, gasket 750 preferably directly contacts the baffle member 702 and is at least partially compressed to some degree while still maintaining the gap 752. The compression of gasket 750 helps to create a good physical seal between the components. As representative alternatives, the moveable baffle member 702 can be moved upward and/or the bather plate 700 can be moved downward to create the desired compression of the gasket 750.

The inner face 748 abuts the barrier plate 700 and the seal ring 720 when the member 730 is secured to barrier plate 700. A gasket (not shown) in groove 754 helps to create a good seal at this interface.

At least one and preferably a plurality of gas introduction channels 756 extend through the rim 736. Generally, using from about 2 to about 10 of these channels substantially equidistantly spaced around the member 730 would be suitable. In one embodiment, using four of such channels was found to be suitable. Gas is introduced to the channels 756 at inlets 758 and exits through outlets 760. The channels are aimed generally onto the baffle member 702 rather than into gap 732 so that gas is not blown directly downward into the underlying process chamber below barrier plate 700. The volume in the gap 752 between the member 730 and the baffle member 702 thus acts like a plenum to help distribute the gas and establish a gas barrier that helps to augment the sealing of the gap 732.

The use of a hybrid strategy improves the seal of gap 732 as demonstrated by experiments in which acidic chemistry was used to treat copper surfaces. In one set of experiments, the chemistry was used to treat copper surfaces in a tool in which a gap between a barrier plate and the adjacent baffle member was sealed using a ring-shaped member as shown in FIGS. 27 to 30. When the seal at gap 732 was established using only physical contact, the copper loss was higher when compared to a seal which utilized both physical contact and gas flow.

Overall, the use of both the gas and physical sealing strategies reduces the copper losses by about 15% to 20%. Since copper metal tends to be more resistant to attack than oxides of copper, and since copper tends to oxidize to a greater degree in the presence of oxygen, larger copper losses during otherwise identical chemical treatments tends to indicate that more oxygen is present when copper losses are greater. Without wishing to be bound, the reduction in copper loss is believed to occur, therefore, because the gas purge helps augment the isolation of the process chamber from the ambient oxygen.

The complete disclosures of the patents, patent documents, and publications cited herein are incorporated by reference in their respective entireties for all purposes as if each were individually incorporated.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A system for processing a microelectronic workpiece, comprising:
    a process chamber housing the workpiece, said process chamber comprising a boundary that isolates the workpiece from ambient air, wherein a portion of the boundary comprises a curtain of a flowing gas;
    a moveable cover overlying the workpiece and defining at least a portion of a boundary of the processing chamber, said cover comprising a first state in which the cover is in a first position during a treatment of the workpiece housed in the process chamber and a second state in which the cover is in a second position that permits egress to the chamber and said cover optionally comprising at least one inlet through which at least one treatment fluid is introduced into the process chamber;
    at least one boundary member having an edge proximal to but spaced apart from the cover when the cover is in the first state such that a gap exists between the cover and the at least one boundary member during a workpiece treatment;
    a curtain of a flowing gas forming a boundary for the gap to help isolate the process chamber from ambient air during at least a portion of a treatment while the cover is in the first state, wherein the curtain of flowing gas flows across and through the gap.

2. A system for processing a microelectronic workpiece, comprising:
    a) a process chamber housing the workpiece, said workpiece having an outer periphery;
    b) a moveable cover overlying the workpiece and having an outer periphery, said cover comprising at least one inlet through which at least one treatment fluid is introduced into the process chamber;
    c) a moveable boundary defining at least a portion of an exhaust duct having an inlet proximal to the outer periphery of the workpiece, said moveable boundary having an inner periphery proximal to but spaced apart from the outer periphery of the cover during at least a portion of a treatment of the workpiece such that a gap exists between the cover and the moveable boundary; and
    d) a curtain of flowing gas forming a boundary across the gap to help isolate the chamber from ambient air during at least a portion of the treatment, wherein the curtain of flowing gas flows across and through the gap.

3. The system of claim 2, wherein the curtain of flowing gas and a physical seal between the moveable cover and the moveable boundary help to isolate the chamber from ambient air.

4. The system of claim 3, further comprising a fluid pathway between the seal and the gap, said pathway comprising a plenum that helps to distribute the flow of the curtain of flowing gas to the gap.

5. The system of claim 4, further comprising a fluid pathway between the seal and the gap, said pathway comprising a plenum that helps to distribute the flow of the curtain of flowing gas to the gap.

6. The system of claim 2, wherein the curtain of flowing gas comprises an annular curtain of flowing gas.

7. The system of claim 2, wherein the moveable cover comprises a barrier plate overlying the process chamber and an annular member attached to the barrier plate, the annular member overlying the moveable boundary and having a surface being spaced apart from the moveable boundary to define a plenum upstream from the gap.

8. The system of claim 7, further comprising an annular seal ring between the barrier plate and the annular member wherein the annular seal ring seals an annular trough, said annular trough being coupled to a plurality of aspirating channels.

9. The system of claim 2, wherein the moveable cover comprises a lower surface angled downward in a radially outward direction relative to an underlying plane of the workpiece.

* * * * *